(12) United States Patent
Jeong et al.

(10) Patent No.: US 11,211,495 B2
(45) Date of Patent: *Dec. 28, 2021

(54) SEMICONDUCTOR DEVICES

(71) Applicant: Samsung Electronics Co., Ltd., Suwon-si (KR)

(72) Inventors: Soojin Jeong, Bucheon-si (KR); Dong Il Bae, Seongnam-si (KR); Geumjong Bae, Suwon-si (KR); Seungmin Song, Hwaseong-si (KR); Junggil Yang, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/922,464

(22) Filed: Jul. 7, 2020

(65) Prior Publication Data

US 2020/0343378 A1 Oct. 29, 2020

Related U.S. Application Data

(63) Continuation of application No. 16/018,121, filed on Jun. 26, 2018, now Pat. No. 10,749,030.

(30) Foreign Application Priority Data

Dec. 8, 2017 (KR) .......................... 10-2017-0168579

(51) Int. Cl.
*H01L 29/78* (2006.01)
*H01L 29/06* (2006.01)
(Continued)

(52) U.S. Cl.
CPC .... *H01L 29/785* (2013.01); *H01L 21/823807* (2013.01); *H01L 27/0688* (2013.01);
(Continued)

(58) Field of Classification Search
CPC ..... H01L 2029/7858; H01L 21/823807; H01L 27/0688; H01L 27/092; H01L 27/0924;
(Continued)

(56) References Cited

U.S. PATENT DOCUMENTS 7,402,483 B2 * 7/2008 Yun .................. H01L 29/42392
257/E21.415
7,427,794 B2 * 9/2008 Chau ..................... H01L 29/785
257/333

(Continued)

OTHER PUBLICATIONS

C.-H. Jan et al., "14 nm SoC Platform Technology for Low Power, High Performance and High Density SoC Products" 2015 Symposium on VLSI Technology (VLSI Technology).

*Primary Examiner* — Mohammed Shamsuzzaman
(74) *Attorney, Agent, or Firm* — Myers Bigel, P.A.

(57) ABSTRACT

A semiconductor device may include first and second channel patterns on a substrate, first and second source/drain patterns in contact respectively with the first and second channel patterns, and first and second gate electrodes respectively overlapping the first and second channel patterns. The first gate electrode may include a first segment between first and second semiconductor patterns of the first channel pattern. The first segment may include a first convex portion protruding toward the first source/drain pattern. The second gate electrode may include a second segment between third and fourth semiconductor patterns of the second channel pattern. The second segment may include a concave portion recessed toward a center of the second segment.

19 Claims, 29 Drawing Sheets

(51) Int. Cl.
    *H01L 29/423*     (2006.01)
    *H01L 27/092*     (2006.01)
    *H01L 29/08*     (2006.01)
    *H01L 29/786*     (2006.01)
    *H01L 29/66*     (2006.01)
    *H01L 21/8238*     (2006.01)
    *H01L 27/06*     (2006.01)

(52) U.S. Cl.
    CPC ........ *H01L 27/092* (2013.01); *H01L 27/0924* (2013.01); *H01L 29/0653* (2013.01); *H01L 29/0847* (2013.01); *H01L 29/42356* (2013.01); *H01L 29/42392* (2013.01); *H01L 29/66772* (2013.01); *H01L 29/78618* (2013.01); *H01L 29/78654* (2013.01); *H01L 2029/7858* (2013.01)

(58) Field of Classification Search
    CPC ............. H01L 29/0653; H01L 29/0847; H01L 29/42356; H01L 29/42392; H01L 29/66772; H01L 29/785; H01L 29/78618; H01L 29/78654
    See application file for complete search history.

(56) References Cited

U.S. PATENT DOCUMENTS

| | | | |
|---|---|---|---|
| 8,022,439 B2 | 9/2011 | Takeshi | |
| 9,362,397 B2* | 6/2016 | Hur | H01L 29/66484 |
| 9,484,423 B2* | 11/2016 | Obradovic | H01L 29/78696 |
| 9,502,518 B2 | 11/2016 | Liu et al. | |
| 9,601,569 B1 | 3/2017 | Suk et al. | |
| 9,704,836 B2 | 7/2017 | Cheng et al. | |
| 10,243,040 B1* | 3/2019 | Park | H01L 29/732 |
| 10,424,651 B2* | 9/2019 | Cheng | H01L 29/42392 |
| 2008/0135949 A1* | 6/2008 | Lo | B82Y 10/00 |
| | | | 257/401 |
| 2011/0147839 A1* | 6/2011 | Yagishita | H01L 29/785 |
| | | | 257/347 |
| 2013/0240979 A1* | 9/2013 | Lim | H01L 27/088 |
| | | | 257/327 |
| 2014/0183599 A1* | 7/2014 | Hong | H01L 29/7848 |
| | | | 257/190 |
| 2014/0264276 A1* | 9/2014 | Chang | H01L 29/78696 |
| | | | 257/24 |
| 2015/0084041 A1* | 3/2015 | Hur | H01L 29/7831 |
| | | | 257/43 |
| 2015/0340293 A1* | 11/2015 | Cheng | H01L 21/324 |
| | | | 438/283 |
| 2016/0087104 A1* | 3/2016 | Lee | H01L 29/0649 |
| | | | 257/192 |
| 2016/0284700 A1* | 9/2016 | Yoon | H01L 29/785 |
| 2016/0308016 A1* | 10/2016 | Choi | H01L 29/7845 |
| 2016/0351715 A1* | 12/2016 | Jung | H01L 29/0847 |
| 2017/0186746 A1* | 6/2017 | Chung | H01L 27/092 |
| 2017/0221992 A1* | 8/2017 | Chang | H01L 29/42392 |
| 2017/0222006 A1 | 8/2017 | Suh et al. | |
| 2018/0040615 A1* | 2/2018 | Chang | H01L 29/785 |

* cited by examiner

SEMICONDUCTOR DEVICES

CROSS-REFERENCE TO RELATED APPLICATIONS

This U.S. nonprovisional application is a continuation of U.S. patent application Ser. No. 16/018,121, filed on Jun. 26, 2018, which claims priority under 35 U.S.C § 119 to Korean Patent Application No. 10-2017-0168579, filed on Dec. 8, 2017, in the Korean Intellectual Property Office, the entire contents of which are hereby incorporated by reference.

TECHNICAL FIELD

Aspects of the present disclosure relate to semiconductor devices, and more particularly, to semiconductor devices that include a gate-all-around type transistor.

BACKGROUND

Semiconductor devices are beneficial in the electronics industry and in other industries because of their small size, their multi-functionality, and/or their low fabrication cost. Semiconductor devices may encompass, as examples, semiconductor memory devices storing logic data, semiconductor logic devices processing operations of logic data, and hybrid semiconductor devices having both memory and logic elements. Semiconductor devices have been increasingly desired for increasing integration with the advanced development of the electronics industry. For example, semiconductor devices have been increasingly requested for high reliability, high speed, and/or multi-functionality. Semiconductor devices are becoming more complicated and integrated to meet these requested characteristics.

SUMMARY

Some embodiments of the inventive concepts of the present disclosure provide semiconductor devices that include a gate-all-around type transistor with enhanced electrical characteristics.

According to some example embodiments of the inventive concepts, a semiconductor device may comprise: a first channel pattern and a second channel pattern on a substrate. The first channel pattern may comprise a first semiconductor pattern and a second semiconductor pattern above the first semiconductor pattern. The second channel pattern may comprise a third semiconductor pattern and a fourth semiconductor pattern above the first semiconductor pattern. The semiconductor device may further include a first source/drain pattern and a second source/drain pattern that may be in contact respectively with the first channel pattern and the second channel pattern, and the first and second source/drain patterns may have different conductivities from each other. The semiconductor device may further include a first gate electrode and a second gate electrode overlapping the first channel pattern and the second channel pattern. The first and second gate electrodes may extend in a first direction. The first gate electrode may comprise a first segment between the first and second semiconductor patterns of the first channel pattern. The first segment may comprise a first convex portion protruding toward the first source/drain pattern. The second gate electrode may comprise a second segment between the third and fourth semiconductor patterns of the second channel pattern. The second segment may comprise a concave portion recessed toward a center of the second segment.

According to some example embodiments of the inventive concepts of the present disclosure, a semiconductor device may comprise: a first channel pattern and a second channel pattern on a substrate. The first channel pattern may include a first semiconductor pattern and a second semiconductor pattern above the first semiconductor pattern. The second channel pattern may comprise a third semiconductor pattern and a fourth semiconductor pattern above the first semiconductor pattern. The semiconductor device may further comprise a first source/drain pattern and a second source/drain pattern that may be in contact with the first channel pattern and the second channel pattern, respectively. The first and second source/drain patterns may have different conductivities from each other. The semiconductor device may further comprise a barrier insulation pattern in contact with a side surface of the second source/drain pattern. The first source/drain pattern may comprise at its side surface a side recession recessed toward a center of the first source/drain pattern. The barrier insulation pattern may comprise a first convex portion protruding in a direction away from the second source/drain pattern.

According to some example embodiments of the inventive concepts of the present disclosure, a semiconductor device may comprise: a substrate having a PMOSFET region and an NMOSFET region; and a first channel pattern and a second channel pattern provided respectively on the PMOSFET region and the NMOSFET region. The first channel pattern may comprise a first semiconductor pattern and a second semiconductor pattern above the first semiconductor pattern, and the second channel pattern may comprise a third semiconductor pattern and a fourth semiconductor pattern above the first semiconductor pattern. The semiconductor device may further comprise a first gate electrode and a second gate electrode overlapping the first channel pattern and the second channel pattern, with the first and second gate electrodes extending in a first direction. The first gate electrode may comprise a first segment between the first and second semiconductor patterns of the first channel pattern. The first segment may comprise a first convex portion protruding in a direction away from a center of the first segment. The second gate electrode may comprise a second segment between the third and fourth semiconductor patterns of the second channel pattern. The second segment may comprise a first concave portion recessed toward a center of the second segment.

DETAILED DESCRIPTION

Figure 1:
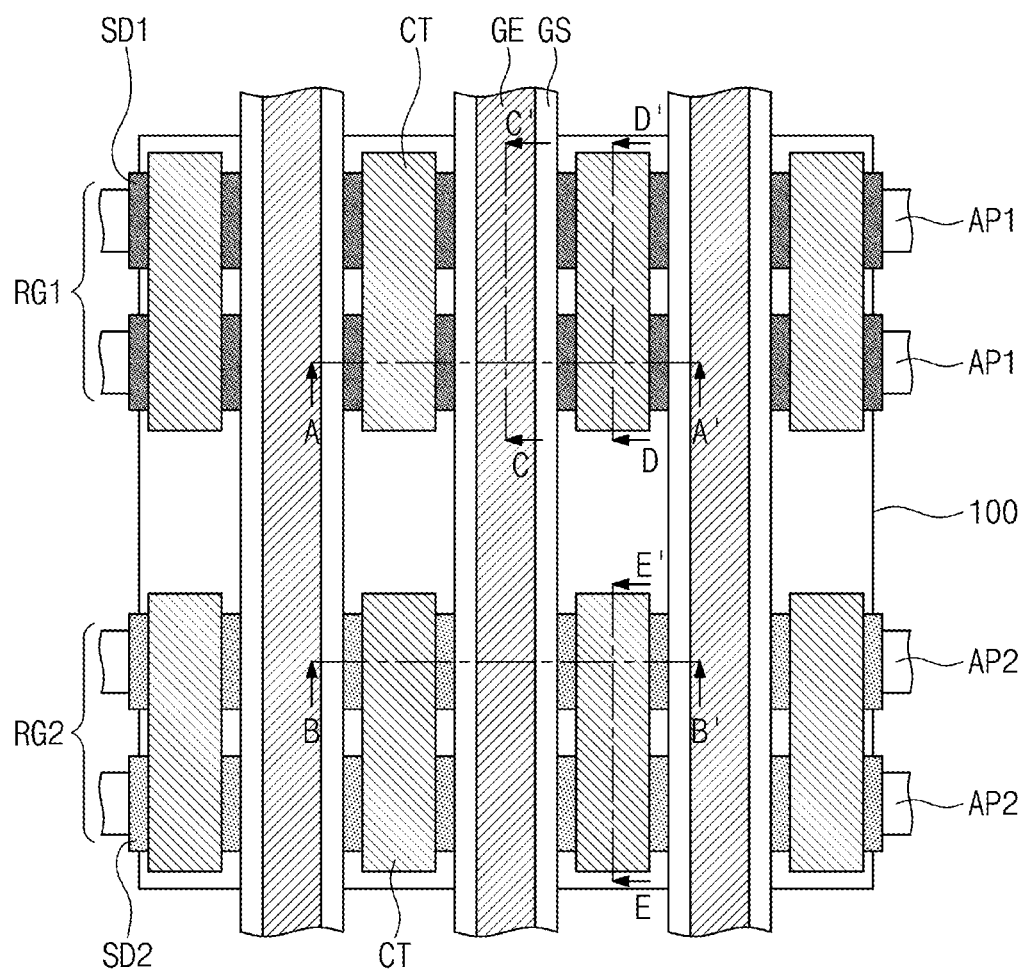
FIG. 1 illustrates a plan view showing a semiconductor device according to aspects of the present disclosure.

FIG. 1 illustrates a plan view showing a semiconductor device according to exemplary embodiments of inventive concepts. FIGS. 2A to 2E are cross-sectional views respectively taken along lines A-A', B-B', C-C', D-D', and E-E' of FIG. 1.

Referring to FIGS. 1 and 2A to 2E, a substrate 100 may be provided. The substrate 100 may include a first region RG1 and a second region RG2. The substrate 100 may be or may include a semiconductor substrate. For example, the substrate 100 may be a silicon substrate, a germanium substrate, or a silicon-on-insulator (SOI) substrate. First transistors may be provided on the first region RG1 of the substrate 100, and second transistors may be provided on the second region RG2 of the substrate 100.

The first and second regions RG1 and RG2 of the substrate 100 may be memory cell regions, on which are formed a plurality of memory cells for storing data. For example, a memory cell region of the substrate 100 may be provided thereon with memory cell transistors constituting a plurality of SRAM cells. The first and second transistors may be ones of the memory cell transistors.

The first and second regions RG1 and RG2 of the substrate 100 may be logic cell regions on which logic transistors are disposed to constitute logic circuits of a semiconductor device. For example, the logic cell region of the substrate 100 may be provided thereon with logic transistors constituting a processor core or an I/O terminal. The first and second transistors may be ones of the logic transistors. The inventive concepts of the present disclosure and the embodiments of the inventive concepts, however, are not limited thereto.

The first transistors of the first region RG1 may have conductivity different from that of the second transistors of the second region RG2. For example, the first transistors of the first region RG1 may be PMOSFETs, and the second transistors of the second region RG2 may be NMOSFETs.

Figure 2A:
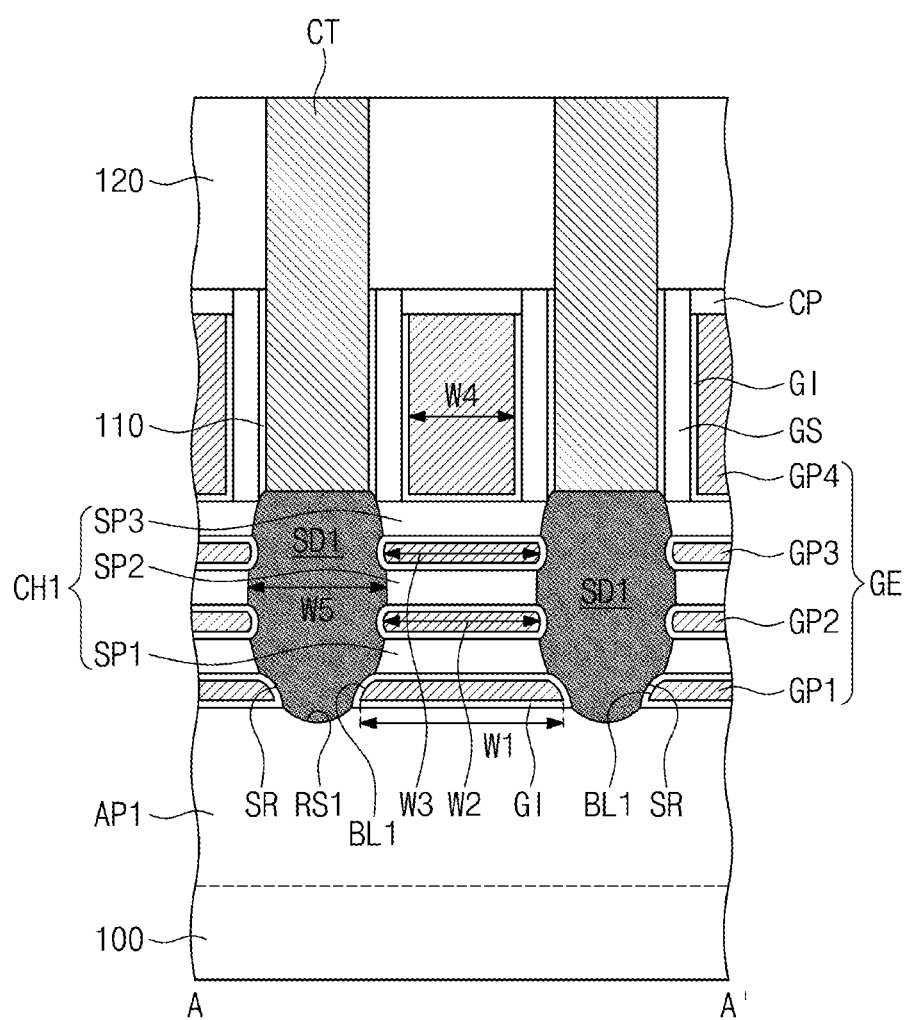
FIGS. 2A to 2E illustrate cross-sectional views respectively taken along lines A-A', B-B', C-C', D-D', and E-E' of FIG. 1.
Figure 2B:
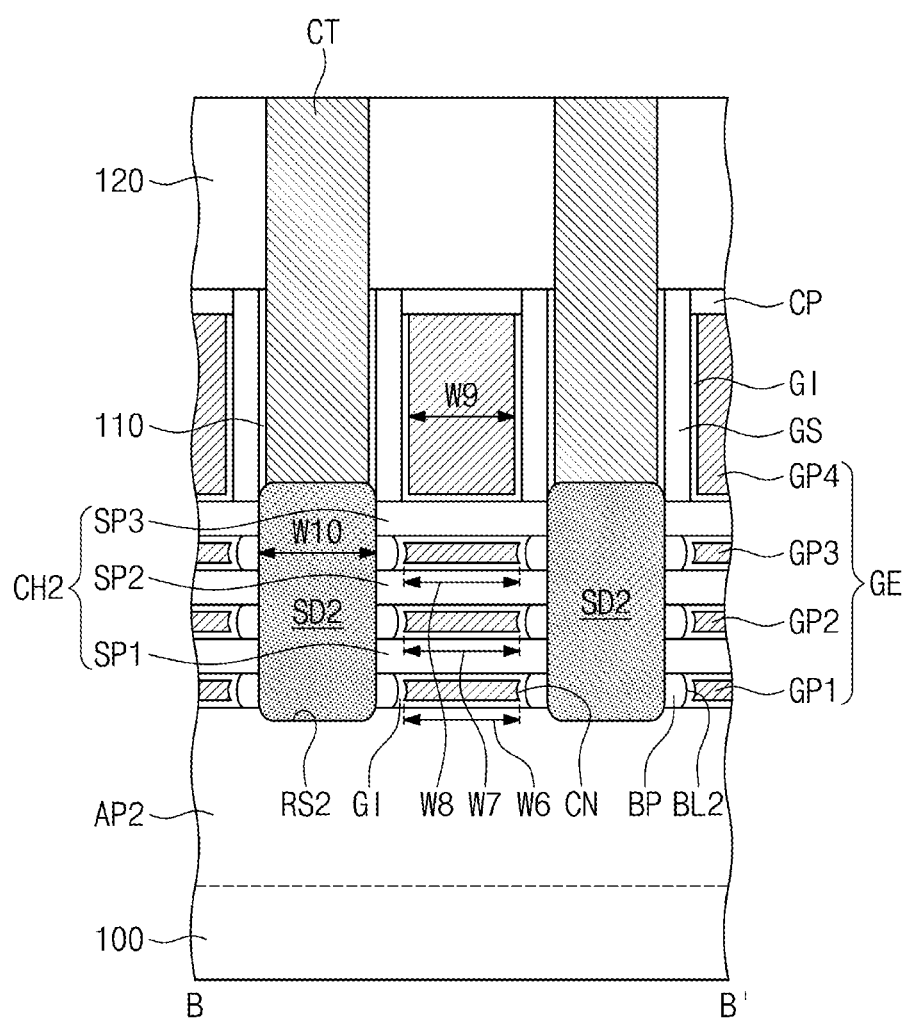
Figure 2C:
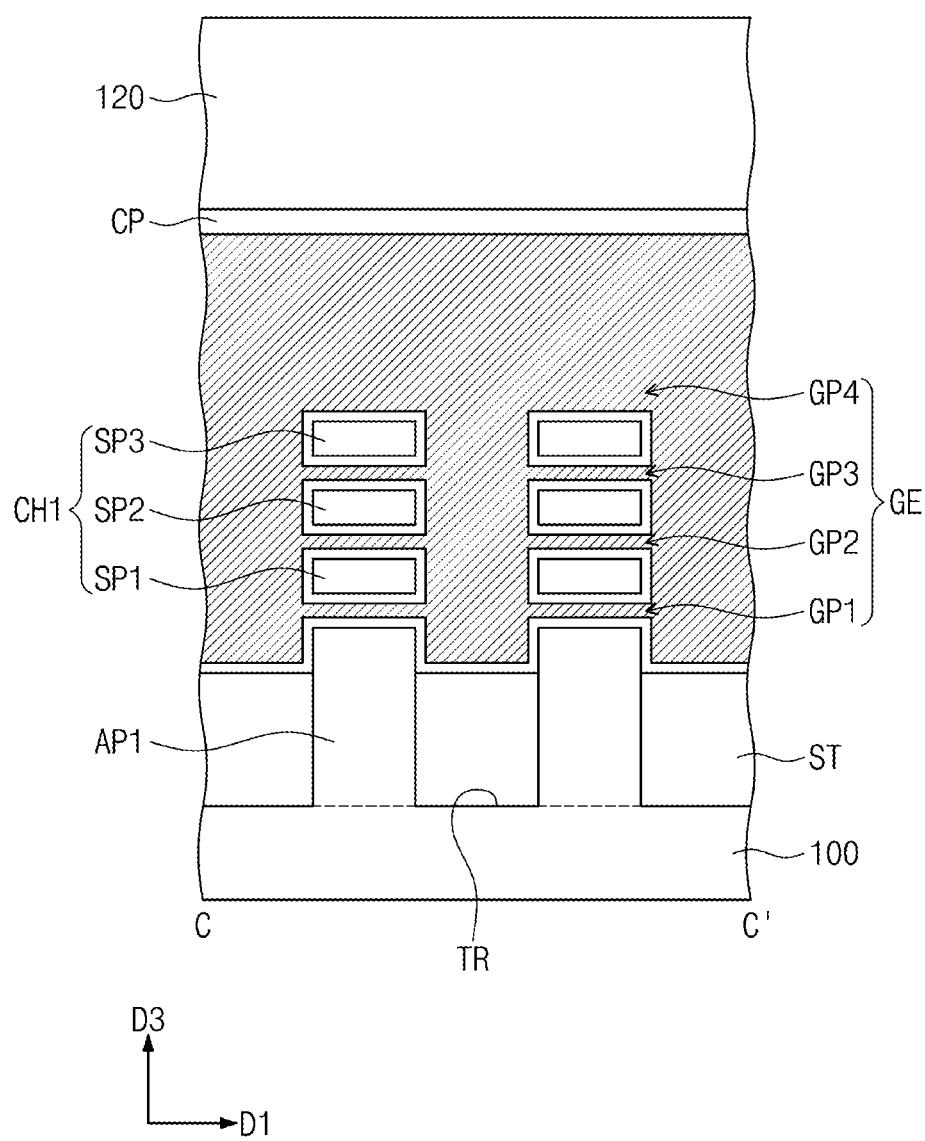
Figure 2D:
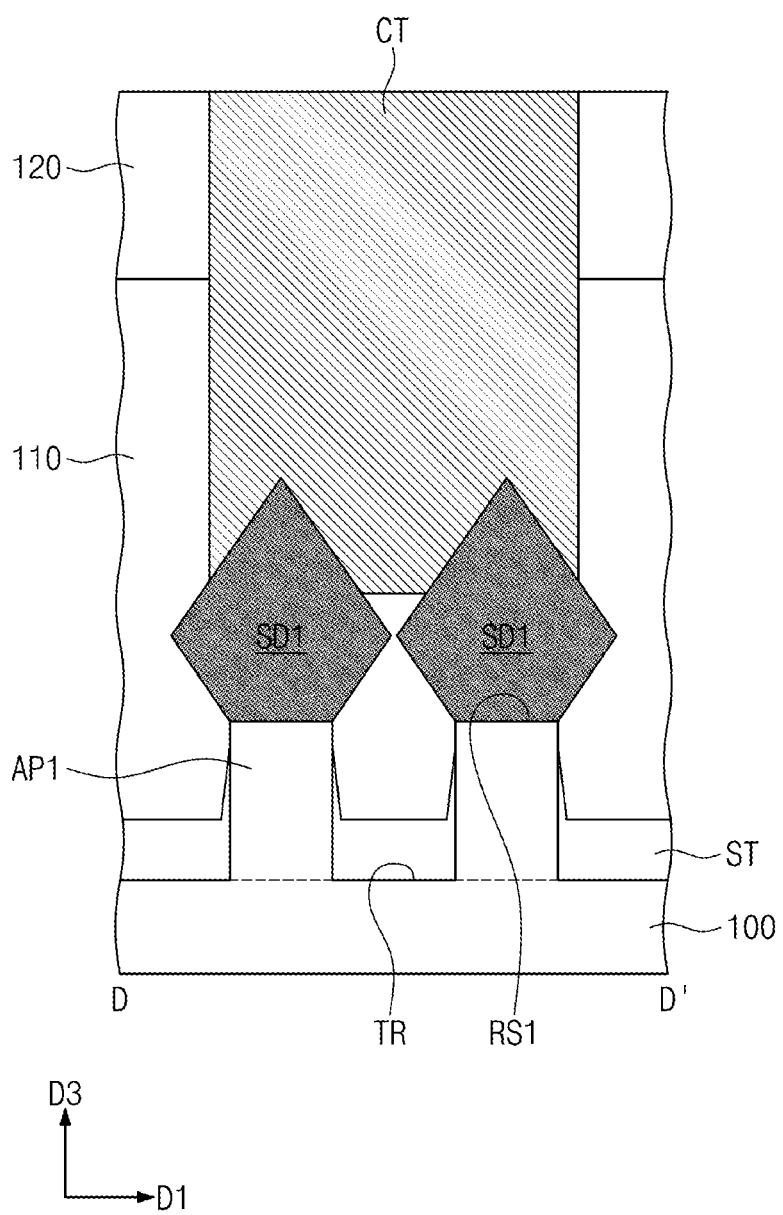
Figure 2E:
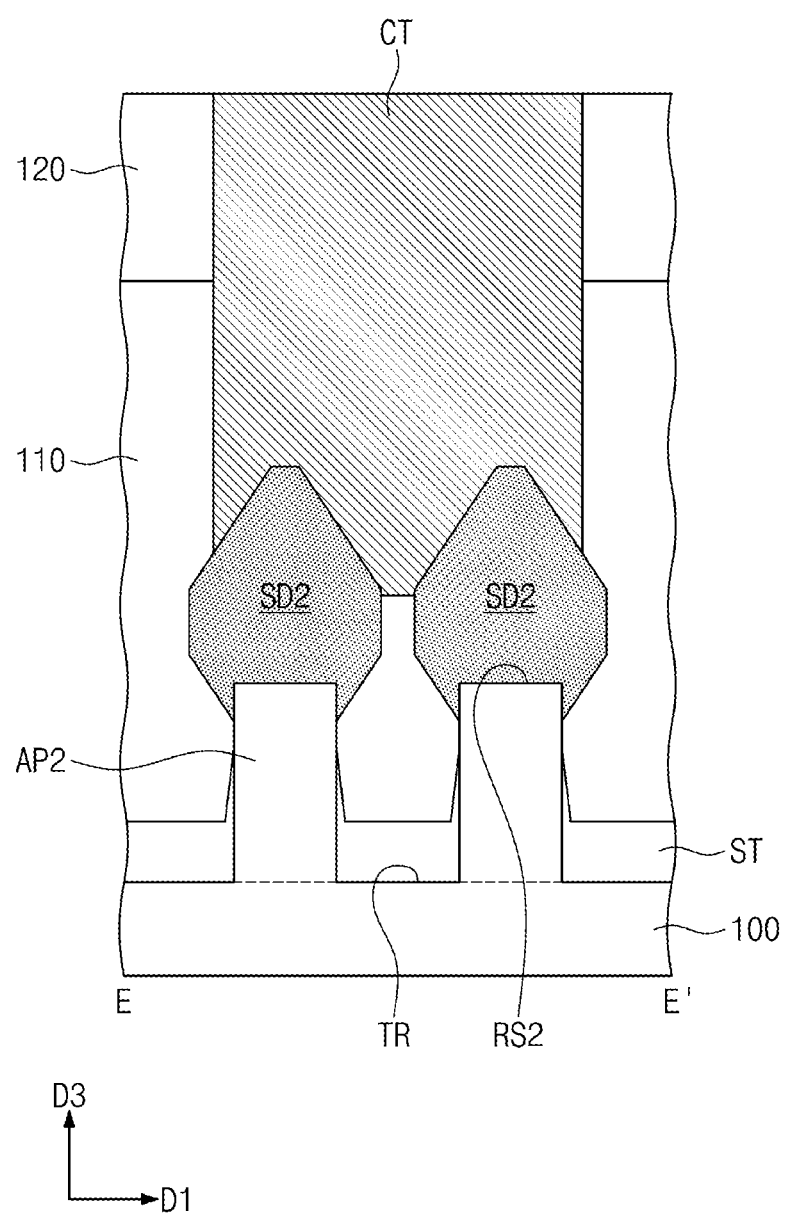

As best seen in FIGS. 2C, 2D, and 2E, a device isolation layer ST may be provided on the substrate 100. The device isolation layer ST may define first and second active patterns AP1 and AP2 on an upper portion of the substrate 100. The first active patterns AP1 may be disposed on the first region RG1. The second active patterns AP2 may be disposed on the second region RG2. Each of the first and second active patterns AP1 and AP2 may have a linear or bar shape extending in a second direction D2, as seen in FIG. 1.

The device isolation layer ST may fill a trench TR between a pair of neighboring first active patterns AP1. The device isolation layer ST may also fill a trench TR between a pair of neighboring second active patterns AP2. The device isolation layer ST may have a top surface lower than those of the first and second active patterns AP1 and AP2.

First channel patterns CH1 and first source/drain patterns SD1 may be provided on each of the first active patterns AP1. Each of the first channel patterns CH1 may be interposed between a pair of neighboring first source/drain patterns SD1. The pair of neighboring first source/drain patterns SD1 may provide a compressive stress to the first channel pattern CH1 therebetween. Second channel patterns CH2 and second source/drain patterns SD2 may be provided on each of the second active patterns AP2. Each of the second channel patterns CH2 may be interposed between a pair of neighboring second source/drain patterns SD2.

Each of the first channel patterns CH1 may include first, second, and third semiconductor patterns SP1, SP2, and SP3 that are sequentially stacked. The first to third semiconductor patterns SP1 to SP3 may be spaced apart from each other in a third direction D3, where the third direction D3 extends perpendicular to a top surface of the substrate 100. The first to third semiconductor patterns SP1 to SP3 may vertically overlap each other (e.g., when viewed in a plan view). Each of the first source/drain patterns SD1 may be in direct contact with a sidewall of each of the first to third semiconductor patterns SP1 to SP3, as best seen in FIG. 2A. For example, the first to third semiconductor patterns SP1 to SP3 may connect a pair of neighboring first source/drain patterns SD1 to each other.

The first to third semiconductor patterns SP1 to SP3 of the first channel pattern CH1 may have the same thickness as each other, or may have different thicknesses from each other. The first to third semiconductor patterns SP1 to SP3 of the first channel pattern CH1 may have different maximum lengths in the second direction D2, as best seen in FIG. 2A. For example, the maximum length in the second direction D2 of the second semiconductor pattern SP2 may be less than the maximum length in the second direction D2 of each of the first and third semiconductor patterns SP1 and SP3.

The first to third semiconductor patterns SP1 to SP3 may include one or more of silicon (Si), germanium (Ge), and silicon-germanium (SiGe). The first channel pattern CH1 may include three semiconductor patterns SP1 to SP3, but the number of the semiconductor patterns is not particularly limited.

With reference to FIG. 2B, each of the second channel patterns CH2 may include first, second, and third semiconductor patterns SP1, SP2, and SP3 that are sequentially stacked. The first to third semiconductor patterns SP1 to SP3 may be spaced apart from each other in the third direction D3, where the third direction D3 extends perpendicular to the top surface of the substrate 100. The first to third semiconductor patterns SP1 to SP3 may vertically overlap each other (e.g., when viewed in a plan view). Each of the second source/drain patterns SD2 may be in direct contact with a sidewall of each of the first to third semiconductor patterns SP1 to SP3, as best seen in FIG. 2B. For example, the first to third semiconductor patterns SP1 to SP3 may connect a pair of neighboring second source/drain patterns SD2 to each other.

The first to third semiconductor patterns SP1 to SP3 of the second channel pattern CH2 may have the same thickness as each other, or may have different thicknesses from each other. The first to third semiconductor patterns SP1 to SP3 of the second channel pattern CH2 may have the same or different maximum lengths in the second direction D2, as best seen in FIG. 2B. For example, the maximum length in the second direction D2 of the first semiconductor pattern SP1 may be greater than the maximum length in the second direction D2 of the second semiconductor pattern SP2. The maximum length in the second direction D2 of the second semiconductor pattern SP2 may be greater than the maximum length in the second direction D2 of the third semiconductor pattern SP3.

The first to third semiconductor patterns SP1 to SP3 may include one or more of silicon (Si), germanium (Ge), and silicon-germanium (SiGe). The second channel pattern CH2 may include three semiconductor patterns SP1 to SP3, but the number of the semiconductor patterns is not particularly limited.

The first to third semiconductor patterns SP1 to SP3 of the first channel pattern CH1 and the first active pattern AP1 may serve as seed layers, from which each of the first source/drain patterns SD1 is grown as an epitaxial pattern. The first source/drain patterns SD1 may be p-type impurity regions. The first source/drain patterns SD1 may include a material that provides a compressive stress to the first channel pattern CH1. For example, the first source/drain patterns SD1 may include a semiconductor element (e.g., SiGe) whose lattice constant is greater than that of a semiconductor element of the substrate 100.

The first to third semiconductor patterns SP1 to SP3 of the second channel pattern CH2 and the second active pattern AP2 may serve as seed layers, from which each of the second source/drain patterns SD2 is grown as an epitaxial pattern. The second source/drain patterns SD2 may be n-type impurity regions. For example, the second source/drain patterns SD2 may include a semiconductor element whose lattice constant is less than that of a semiconductor element of the substrate 100. Alternatively, the second source/drain patterns SD2 may include the same semiconductor element as that of the substrate 100.

A semiconductor element contained in the first source/drain patterns SD1 may be different from a semiconductor element contained in the second source/drain patterns SD2. Cross-sectional shapes in a first direction D1 of the first source/drain patterns SD1 may be different from cross-sectional shapes in the second direction D2 of the second source/drain patterns SD2 (as seen in FIGS. 2D and 2E).

Gate electrodes GE may be provided which extend in the first direction D1 while running across or overlapping the first and second channel patterns CH1 and CH2. The gate electrodes GE may be spaced apart from each other in the second direction D2 (as seen in FIG. 1). The gate electrodes GE may vertically overlap the first and second channel patterns CH1 and CH2. The gate electrode GE may include one or more of conductive metal nitride (e.g., titanium nitride or tantalum nitride) and metal (e.g., titanium, tantalum, tungsten, copper, or aluminum), as examples.

The gate electrode GE may surround each of the first to third semiconductor patterns SP1 to SP3 of the first channel pattern CH1. For example, the gate electrode GE may surround top and bottom surfaces and opposite sidewalls of each of the first to third semiconductor patterns SP1 to SP3 (see FIG. 2C). The gate electrode GE may surround each of the first to third semiconductor patterns SP1 to SP3 of the second channel pattern CH2. In this sense, the first and second transistors according to some embodiments of the inventive concepts of the present disclosure may be gate-all-around type field effect transistors.

A pair of gate spacers GS may be disposed on opposite sidewalls of each of the gate electrodes GE. The gate spacers GS may extend in the first direction D1 along the gate electrode GE. The gate spacers GS may have top surfaces higher than that of the gate electrode GE. The top surfaces of the gate spacers GS may be coplanar with that of a first interlayer dielectric layer 110 which will be discussed further herein. The gate spacers GS may include one or more of SiCN, SiCON, and SiN. Alternatively, the gate spacers GS may include a multiple layer consisting of two or more of SiCN, SiCON, and SiN.

A gate dielectric pattern GI may be interposed between each of the gate electrodes GE and each of the first and second channel patterns CH1 and CH2. The gate dielectric pattern GI may surround (e.g., may substantially surround) each of the first to third semiconductor patterns SP1 to SP3. The gate dielectric pattern GI may be interposed between the gate electrode GE and each of the first to third semiconductor patterns SP1 to SP3. The gate dielectric pattern GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate capping pattern CP may be provided on each of the gate electrodes GE. The gate capping pattern CP may extend in the first direction D1 along the gate electrode GE. For example, the gate capping pattern CP may be on an upper surface of the gate electrode GE. The gate capping pattern CP may include a material exhibiting an etch selectivity to a first interlayer dielectric layer 110 which will be discussed further herein. For example, the gate capping pattern CP may include one or more of SiON, SiCN, SiCON, and SiN.

A first interlayer dielectric layer 110 may be provided on a surface (e.g., an entire surface) of the substrate 100. The first interlayer dielectric layer 110 may cover the device isolation layer ST, the gate electrodes GE, and the first and second source/drain patterns SD1 and SD2. The first interlayer dielectric layer 110 may have a top surface substantially coplanar with those of the gate capping patterns CP. A second interlayer dielectric layer 120 may be provided on the first interlayer dielectric layer 110. For example, the first and second interlayer dielectric layers 110 and 120 may include a silicon oxide layer or a silicon oxynitride layer.

Contacts CT may be provided that penetrate the first and second interlayer dielectric layers 110 and 120 and come into connection with the first and second source/drain patterns SD1 and SD2. The contacts CT may include a metallic material (e.g., titanium, tantalum, tungsten, copper, or aluminum), as an example.

The first transistor on the first region RG1 will now be further discussed in detail, referring back to FIG. 2A. The gate electrode GE on the first region RG1 may include first, second, third, and fourth segments GP1, GP2, GP3, and GP4. The first segment GP1 may be interposed between the first active pattern AP1 and the first semiconductor pattern SP1, the second segment GP2 may be interposed between the first semiconductor pattern SP1 and the second semiconductor pattern SP2, the third segment GP3 may be interposed between the second semiconductor pattern SP2 and the third semiconductor pattern SP3, and the fourth segment GP4 may be provided on the third semiconductor pattern SP3.

A width in the second direction D2 of the first segment GP1 may increase with decreasing distance from the substrate 100, as seen in FIG. 2A. Stated differently, a width of the first segment GP1 nearer to the substrate 100 may be greater than a width of the first segment GP1 further from the substrate 100. A maximum width in the second direction D2 of the first segment GP1 may be a first width W1. A width in the second direction D2 of the second segment GP2 may be less than the first width W1 of the first segment GP1. For example, a maximum width in the second direction D2 of the second segment GP2 may be a second width W2. The second width W2 may be less than the first width W1. A width in the second direction D2 of the third segment GP3 may be greater than the second width W2 of the second segment GP2. For example, a maximum width in the second direction D2 of the third segment GP3 may be a third width W3. The third width W3 may be greater than the second width W2.

A width in the second direction D2 of the fourth segment GP4 may be less than the second width W2 of the second segment GP2. For example, a maximum width in the second direction D2 of the fourth segment GP4 may be a fourth width W4. The fourth width W4 may be less than the second width W2.

Each of the first to third segments GP1 to GP3 may include opposite ends adjacent to the first source/drain patterns SD1. Each of the opposite ends may have a convexly curved shape. For example, each of the opposite ends may have a curvature other than zero. The opposite ends may face in the second direction D2. Each of the first to third segments GP1 to GP3 may accordingly include first convex portions BL1. The first convex portions BL1 may protrude toward the first source/drain patterns SD1.

Each of the first source/drain patterns SD1 may fill a first recession RS1 formed on, or in, an upper portion of the first active pattern AP1. The first recession RS1 may be defined between the first channel patterns CH1 adjacent to each other. The first recession RS1 may have a floor that is lower than the top surface of the first active pattern AP1.

A maximum width in the second direction D2 of each of the first source/drain patterns SD1 may be a fifth width W5. Each of the first source/drain patterns SD1 may have a middle portion whose width corresponds to the fifth width W5. The middle portion of each of the first source/drain patterns SD1 may be placed at the same level as that of the second semiconductor pattern SP2. Stated differently, the middle portion of each of the first source/drain patterns SD1 may be adjacent to the second semiconductor pattern SP2. A width in the second direction D2 of each of the first source/drain patterns SD1 may increase from an upper portion of the first source/drain patterns SD1 toward the middle portion of the first source/drain patterns SD1. The upper portion of the first source/drain patterns SD1 may be located a first distance from the substrate 100, and the middle portion may be located at a second distance from the substrate 100 that is less than the first distance. The width in the second direction D2 of each of the first source/drain patterns SD1 may decrease from the middle portion of the first source/drain patterns SD1 toward a lower portion of the first source/drain patterns SD1. The lower portion of the first source/drain patterns SD1 may be located a third distance from the substrate 100, and the middle portion may be located at a second distance from the substrate 100 that is greater than the third distance.

Each of the first source/drain patterns SD1 may include side recessions SR adjacent to the first to third segments GP1 to GP3 of the gate electrode GE. Each of the side recessions SR may be placed at the same level as that of a corresponding one of the first to third segments GP1 to GP3 of the gate electrode GE. That is, each of the side recessions SR may be adjacent to a corresponding one of the first to third segments GP1 to GP3 of the gate electrode GE. Each of the side recessions SR may have a concavely curved shape that conforms to that of a corresponding one of the first convex portions BL1 included in each of the first to third segments GP1 to GP3. For example, each of the side recessions SR may have a curvature other than zero. The side recessions SR may correspondingly face the first convex portions BL1 of the first to third segments GP1 to GP3.

The gate dielectric patterns GI may be interposed between each of the first source/drain patterns SD1 and the first to third segments GP1 to GP3. For example, the gate dielectric patterns GI may be correspondingly interposed between the side recessions SR of the first source/drain patterns SD1 and the first convex portions BL1 of the first to third segments GP1 to GP3. The gate dielectric patterns GI may be in direct contact with the first source/drain patterns SD1. Each of the first source/drain patterns SD1 may have a lower portion interposed between a pair of neighboring first segments GP1. A width in the second direction D2 of the lower portion of the first source/drain pattern SD1 may decrease toward the substrate 100. That is, a width in the second direction D2 of the lower portion at a first distance from the substrate 100 may be greater than a width in the second direction D2 of the lower portion at a second distance from the substrate, where the first distance is greater than the second distance.

The second transistor on the second region RG2 will now be further discussed in detail, with reference to FIG. 2B. The gate electrode GE on the second region RG2 may include first, second, third, and fourth segments GP1 to GP4, respectively. The first segment GP1 may be interposed between the second active pattern AP2 and the first semiconductor pattern SP1, the second segment GP2 may be interposed between the first semiconductor pattern SP1 and the second semiconductor pattern SP2, the third segment GP3 may be interposed between the second semiconductor pattern SP2 and the third semiconductor pattern SP3, and the fourth segment GP4 may be provided on the third semiconductor pattern SP3.

Barrier insulation patterns BP may be interposed between each of the second source/drain patterns SD2 and the first to third segments GP1 to GP3. The barrier insulation patterns BP may separate the gate dielectric patterns GI from the second source/drain patterns SD2. For example, the barrier insulation patterns BP may include a silicon nitride layer. Each of the barrier insulation patterns BP may have an end that faces the gate electrode GE. The end may have a convexly curved shape. For example, the end may have a curvature other than zero. Each of the barrier insulation patterns BP may accordingly have a second convex portion BL2. The second convex portion BL2 may protrude toward the gate electrode GE.

Maximum widths in the second direction D2 of the first to third segments GP1 to GP3 may be substantially the same as each other, or may be different from each other. For example, the maximum width in the second direction D2 of the first segment GP1 may be a sixth width W6. A width in the second direction D2 of the second segment GP2 may be less than the sixth width W6 of the first segment GP1. For example, the maximum width in the second direction D2 of the second segment GP2 may be a seventh width W7. The seventh width W7 may be less than the sixth width W6. A width in the second direction D2 of the third segment GP3 may be less than the seventh width W7 of the second segment GP2. For example, the maximum width in the second direction D2 of the third segment GP3 may be an eighth width W8. The eighth width W8 may be less than the seventh width W7. The maximum width in the second direction D2 of the fourth segment GP4 may be a ninth width W9. The ninth width W9 may be substantially the same as the eighth width W8.

The sixth to eighth widths W6 to W8 of the first to third segments GP1 to GP3 on the second region RG2 may be less than the first width W1 of the first segment GP1 on the first region RG1 discussed above. The sixth to eighth widths W6 to W8 of the first to third segments GP1 to GP3 on the second region RG2 may be less than the third width W3 of the third segment GP3 on the first region RG1 discussed above.

Each of the first to third segments GP1 to GP3 may include opposite ends adjacent to the barrier insulation patterns BP. Each of the opposite ends may have a concavely curved shape that conforms to that of the second convex portion BL2 of the barrier insulation pattern BP. For example, each of the opposite ends may have a curvature other than zero. The opposite ends may face in the second direction D2. Each of the first to third segments GP1 to GP3 may accordingly include concave portions CN. The concave portions CN may be recessed toward a center of the each of the first to third segments GP1 to GP3.

Each of the second source/drain patterns SD2 may fill a second recession RS2 formed on, or in, an upper portion of the second active pattern AP2. The second recession RS2 may be defined between the second channel patterns CH2 adjacent to each other. The second recession RS2 may have a floor that is lower than the top surface of the second active pattern AP2.

A maximum width in the second direction D2 of each of the second source/drain patterns SD2 may be a tenth width W10. A width in the second direction D2 of each of the second source/drain patterns SD2 may be uniform or gradually smaller from upper to lower portions of the each of the second source/drain patterns SD2. The lower portions of the second source/drain patterns SD2 may be located a first distance from the substrate 100, and the upper portions of the second source/drain patterns SD2 may be located at a second distance from the substrate 100 that is greater than the first distance.

The first source/drain pattern SD1 may have a bottom surface in contact with the top surface of the first active pattern AP1, and the second source/drain pattern SD2 may have a bottom surface in contact with the top surface of the second active pattern AP2. A semiconductor device according to some embodiments of inventive concepts may therefore minimize or prevent a leakage current occurred at the lower portion of each of the first and second source/drain patterns SD1 and SD2.

Figure 8A:
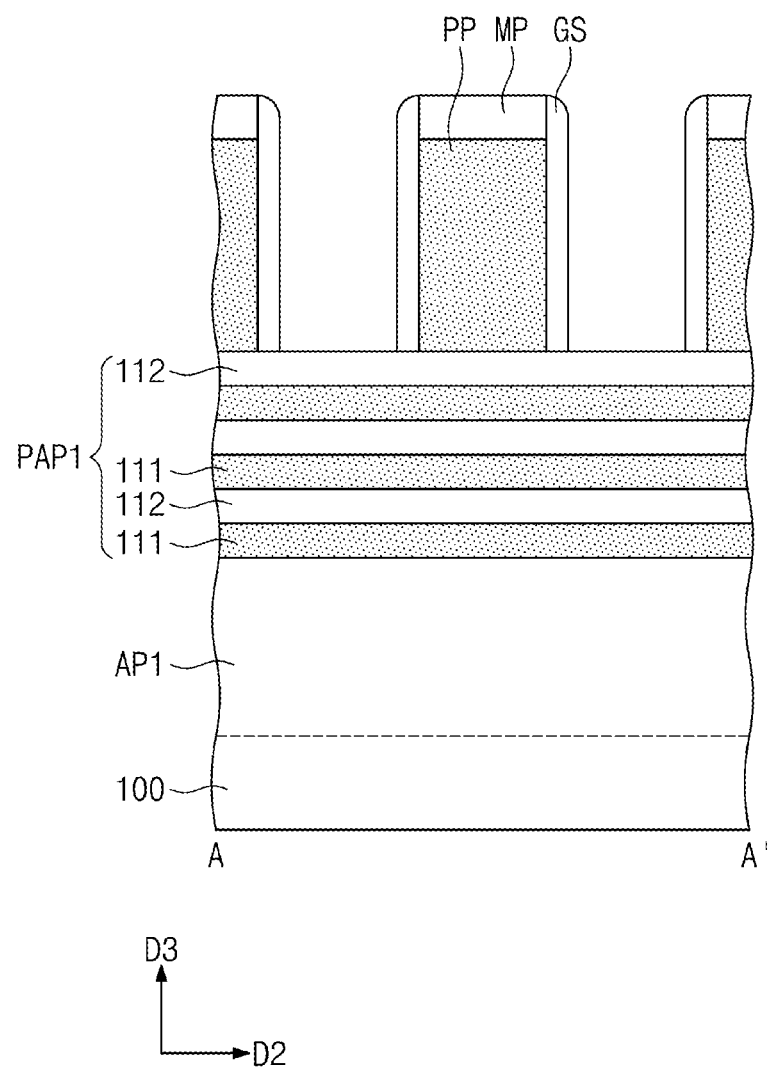
Figure 8B:
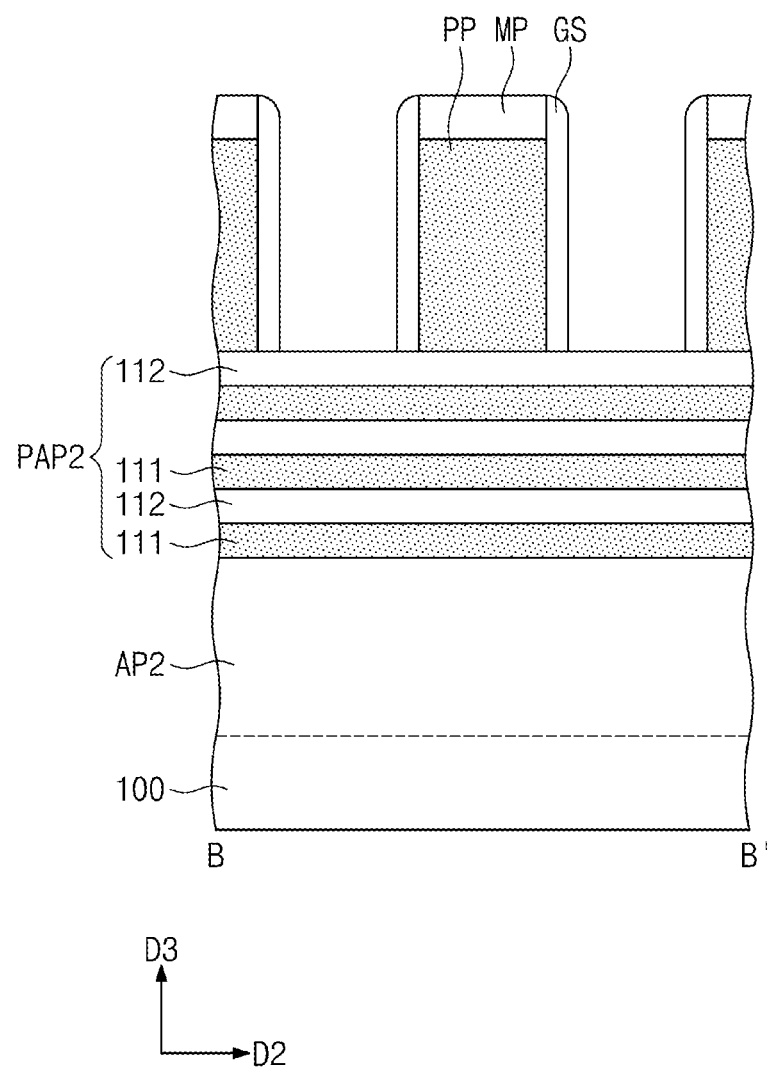
Figure 8C:
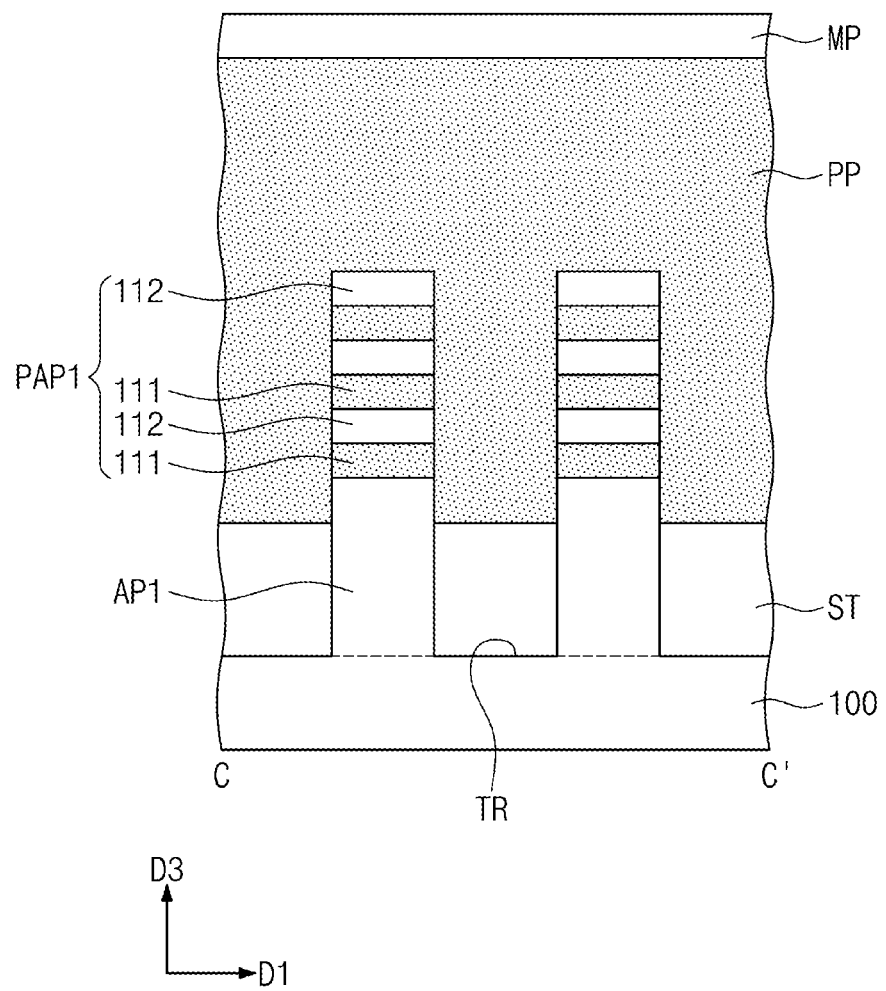
Figure 8D:
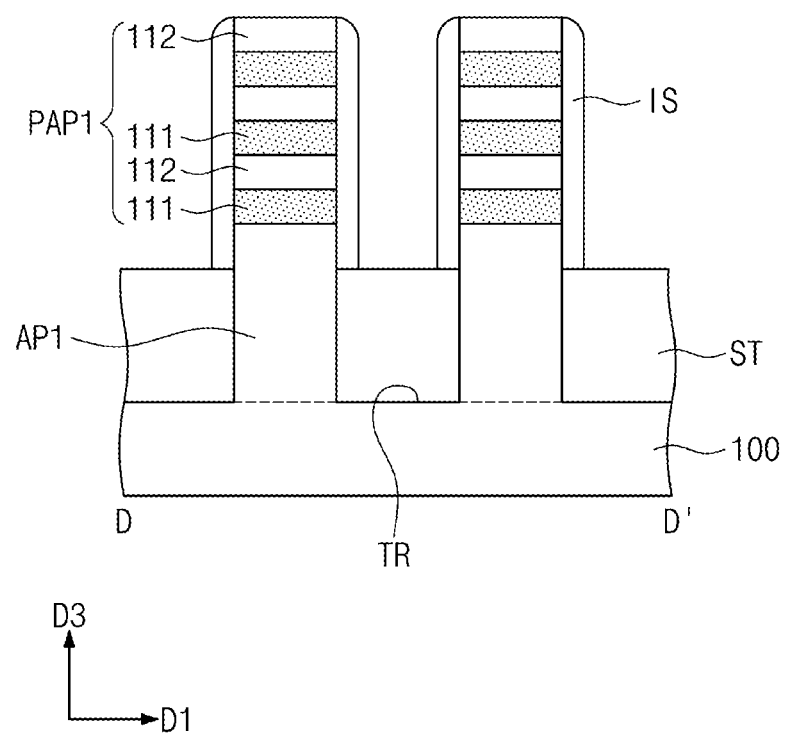
FIGS. 8D, 10D, and 12D illustrate cross-sectional views taken along line D-D' of FIGS. 7, 9, and 11, respectively.
Figure 9:
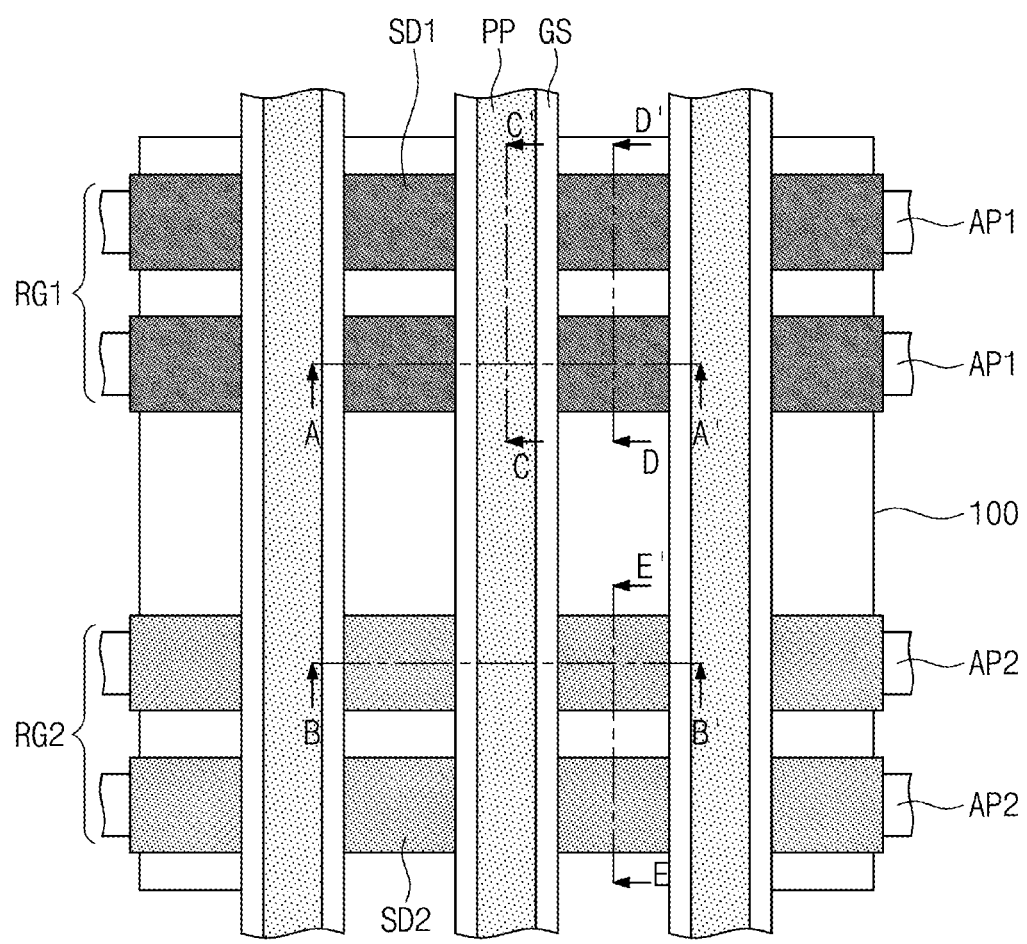
Figure 10A:
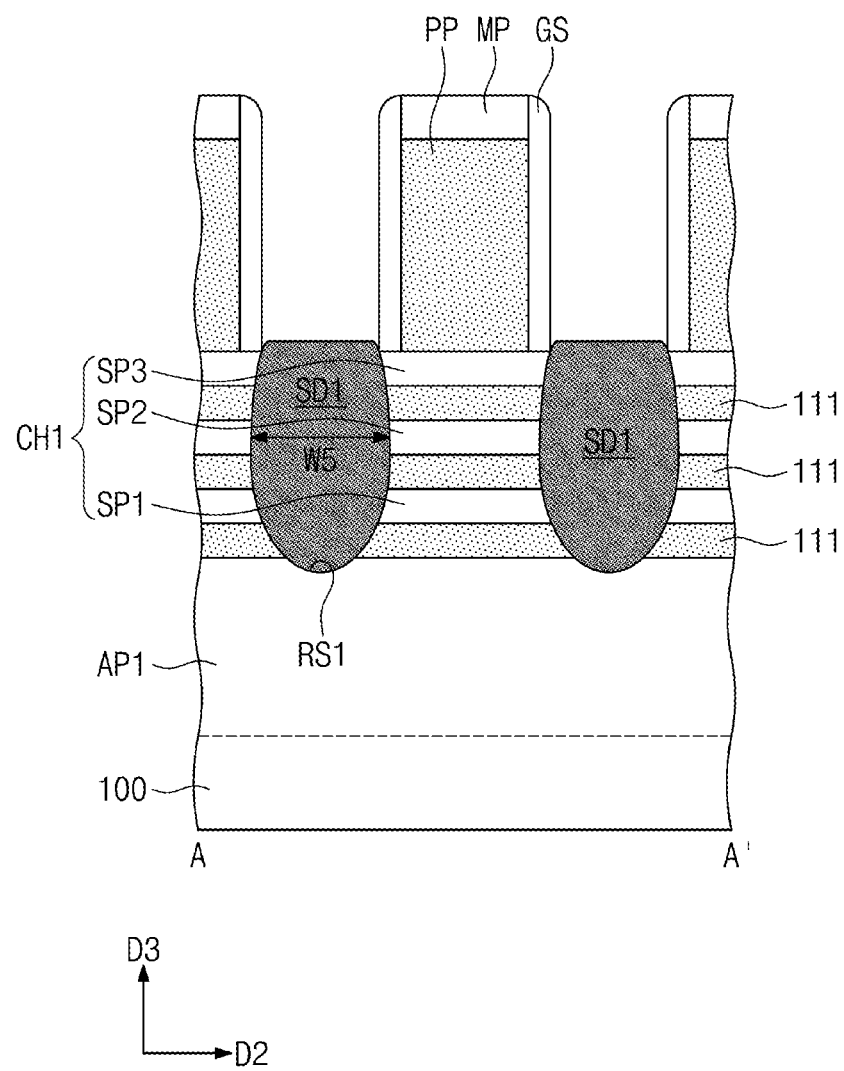
Figure 10B:
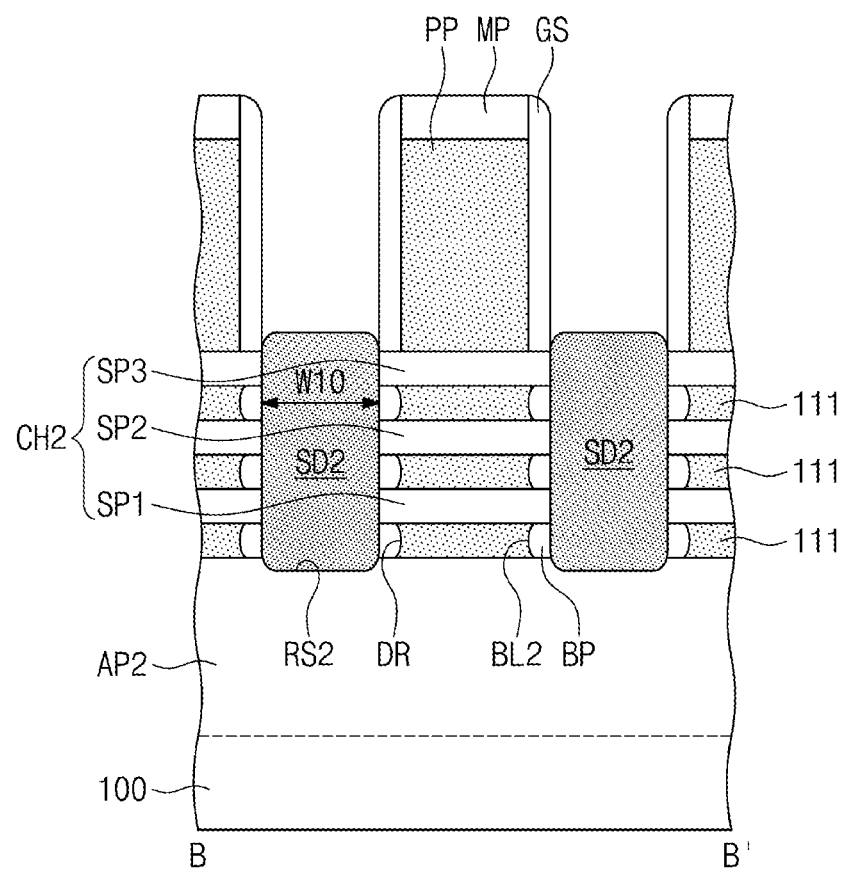
Figure 10C:
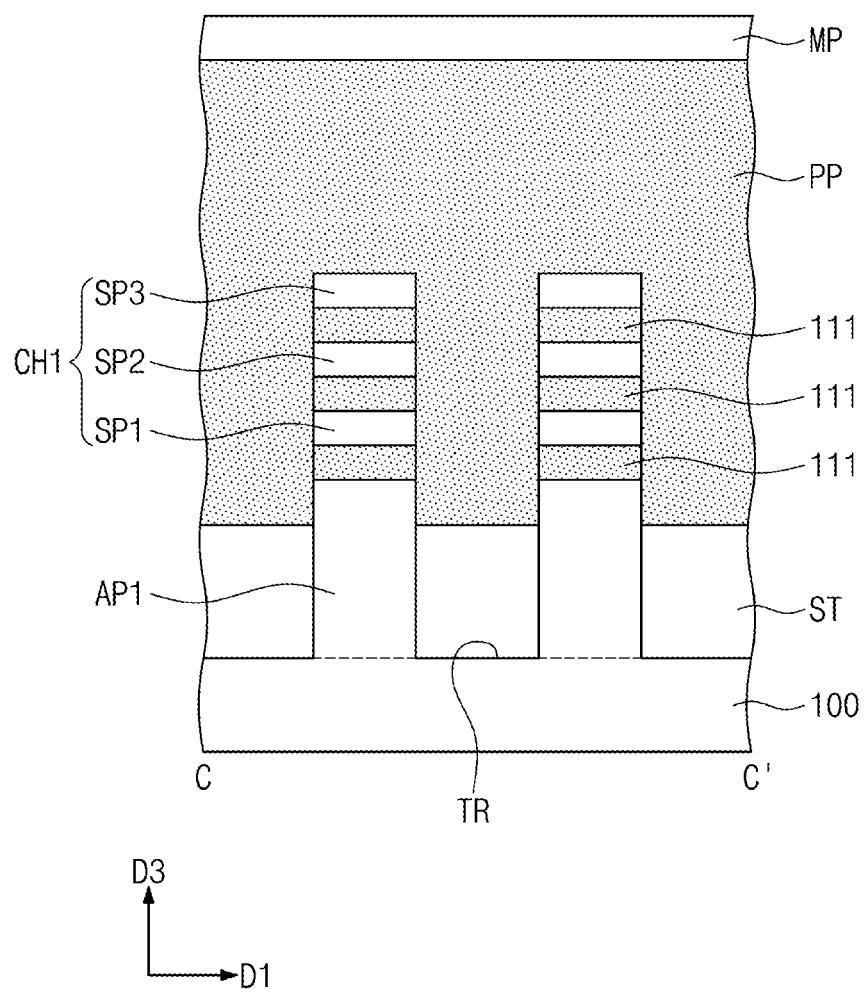
Figure 10D:
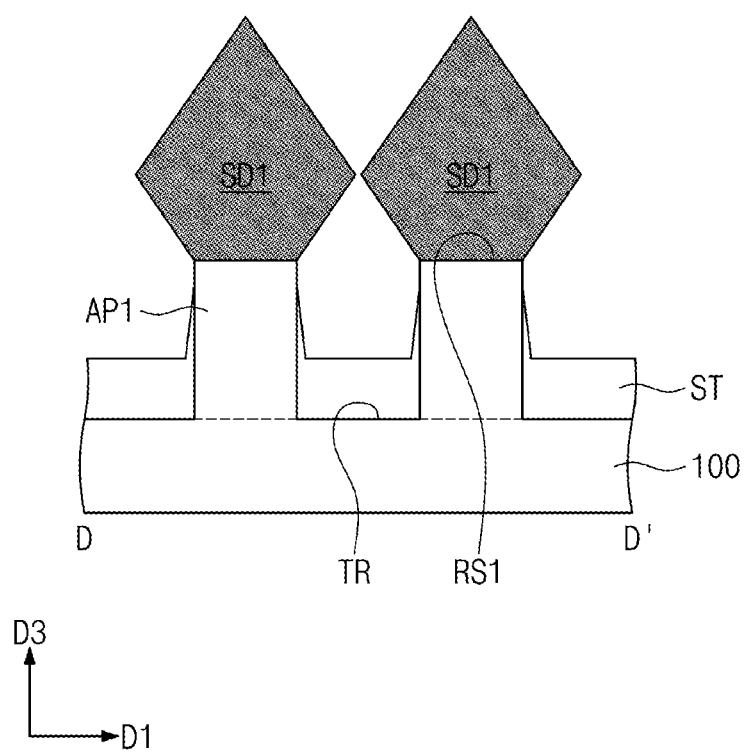
Figure 10E:
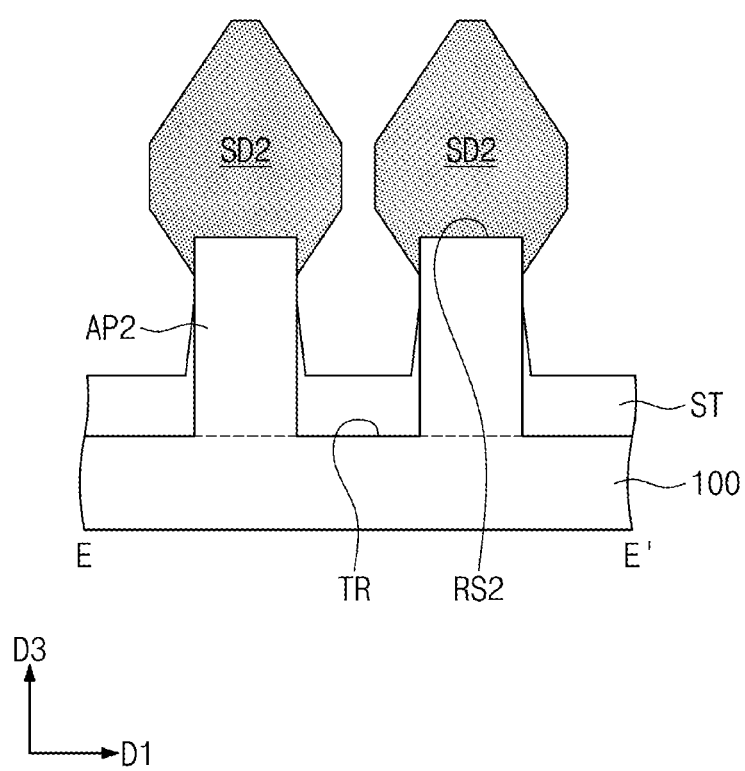
FIGS. 10E and 12E illustrate cross-sectional views taken along line E-E' of FIGS. 9 and 11, respectively.
Figure 11:
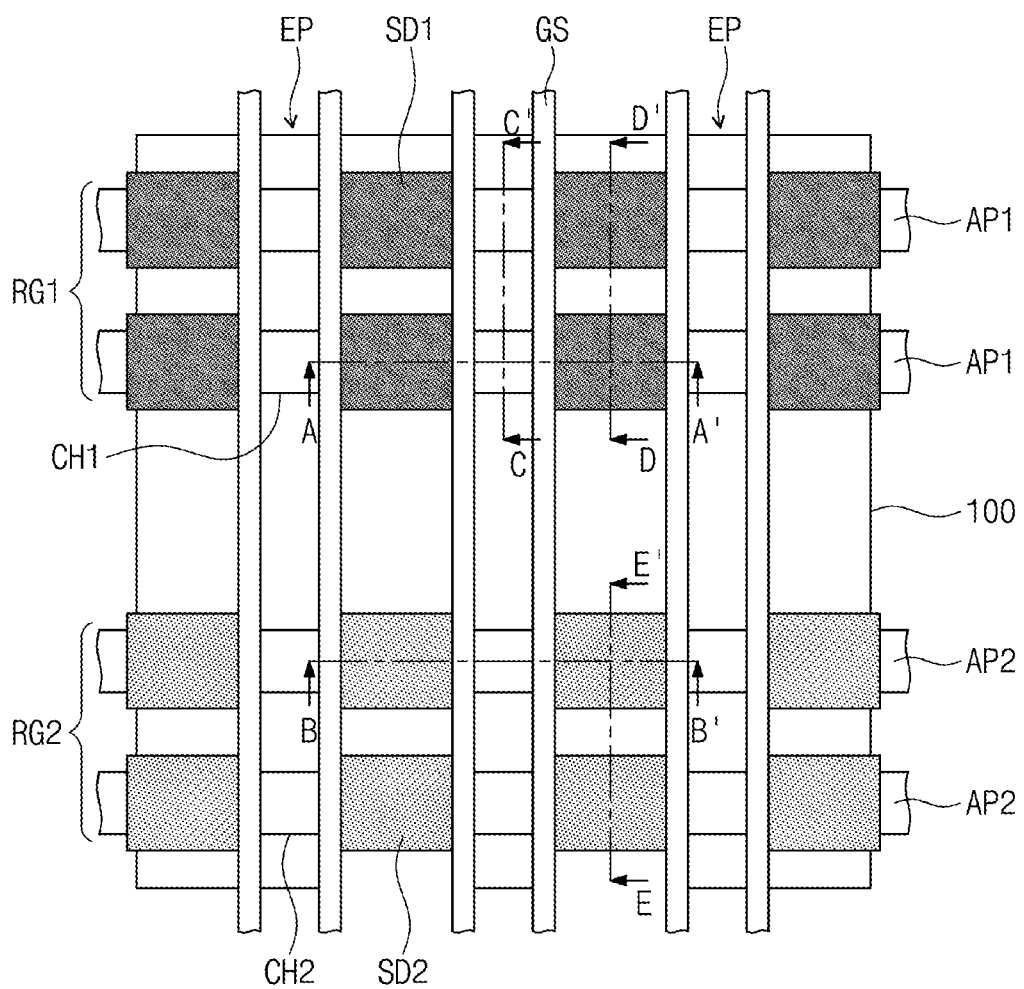
Figure 12A:
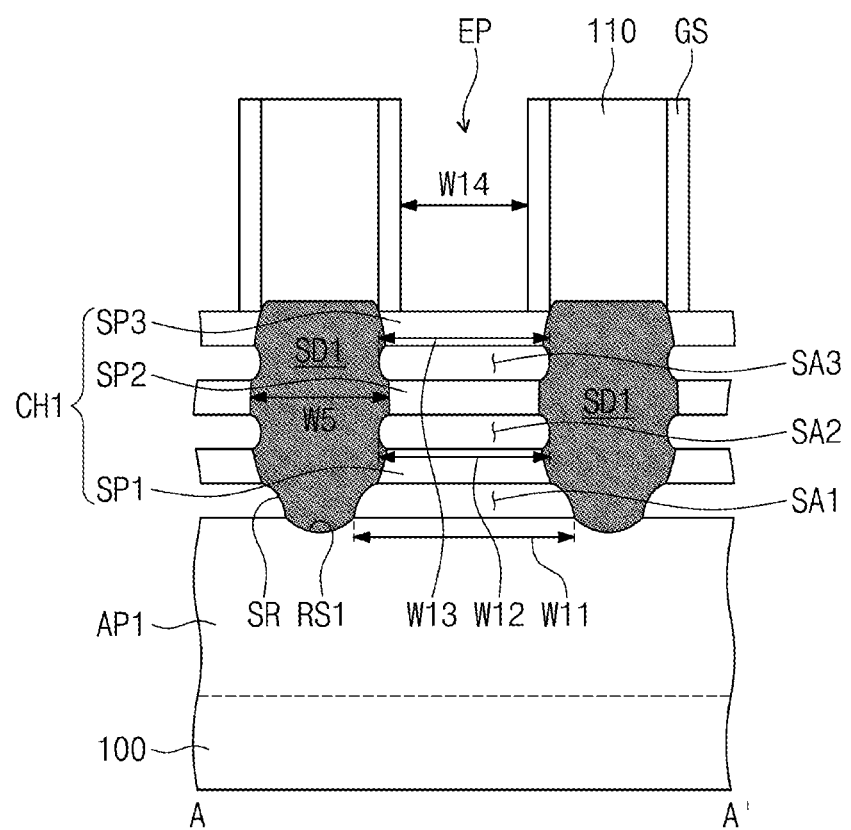
Figure 12B:
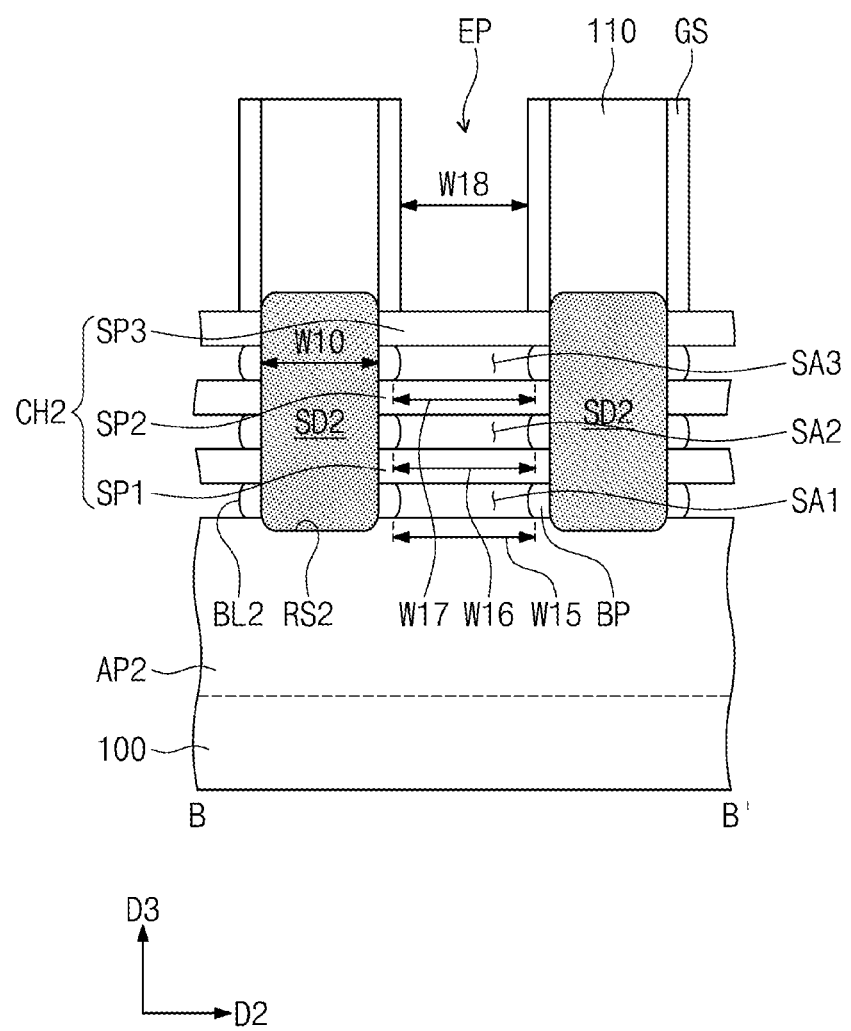
Figure 12C:
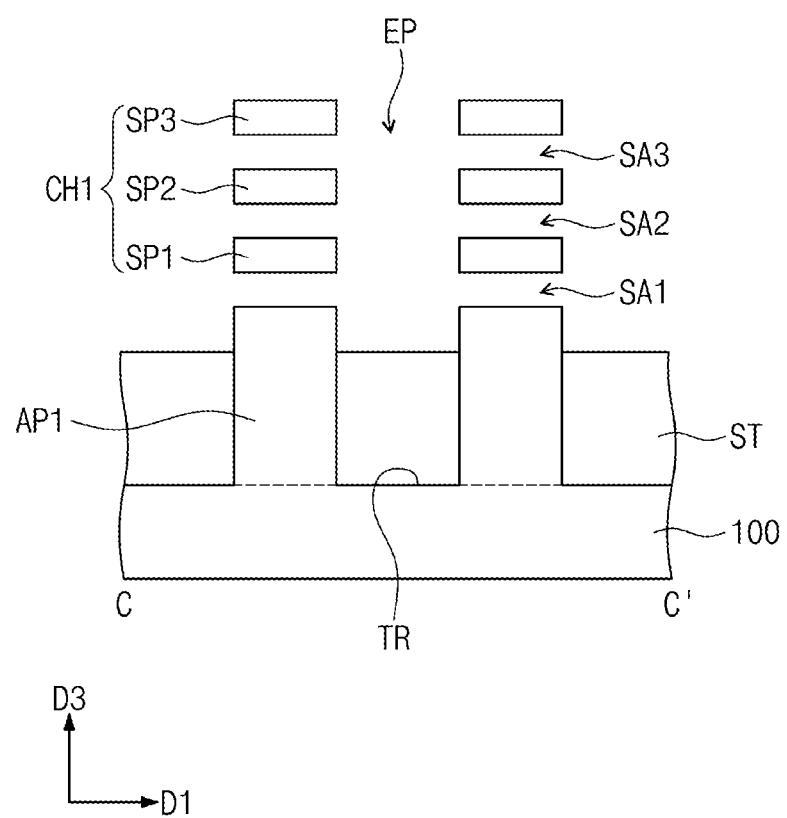
Figure 12D:
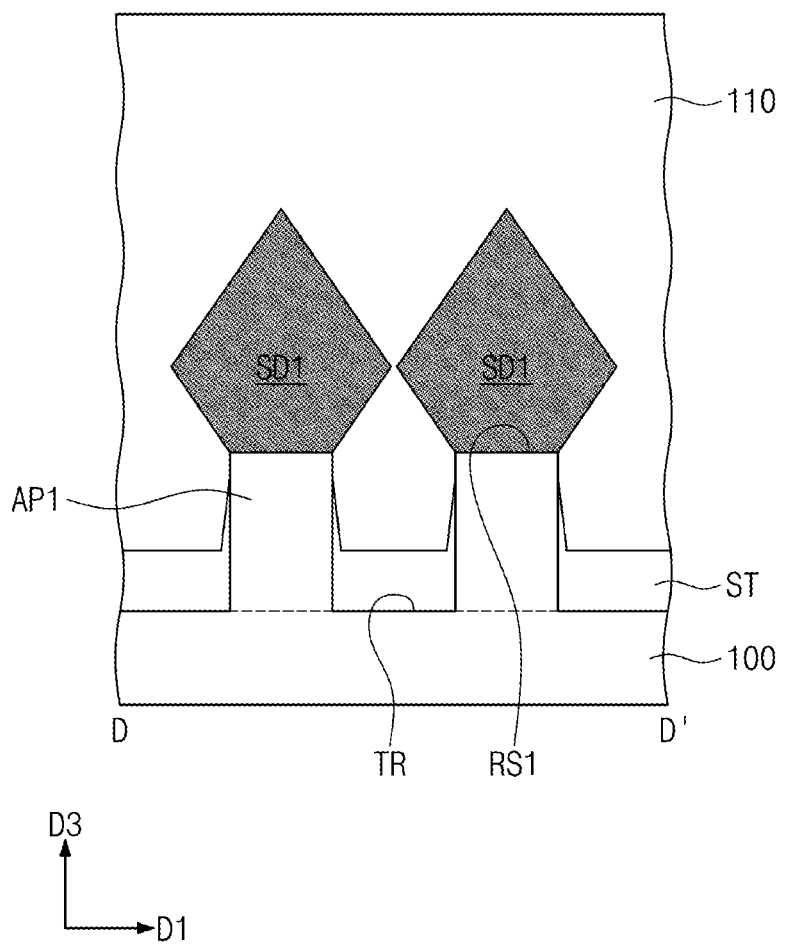
Figure 12E:
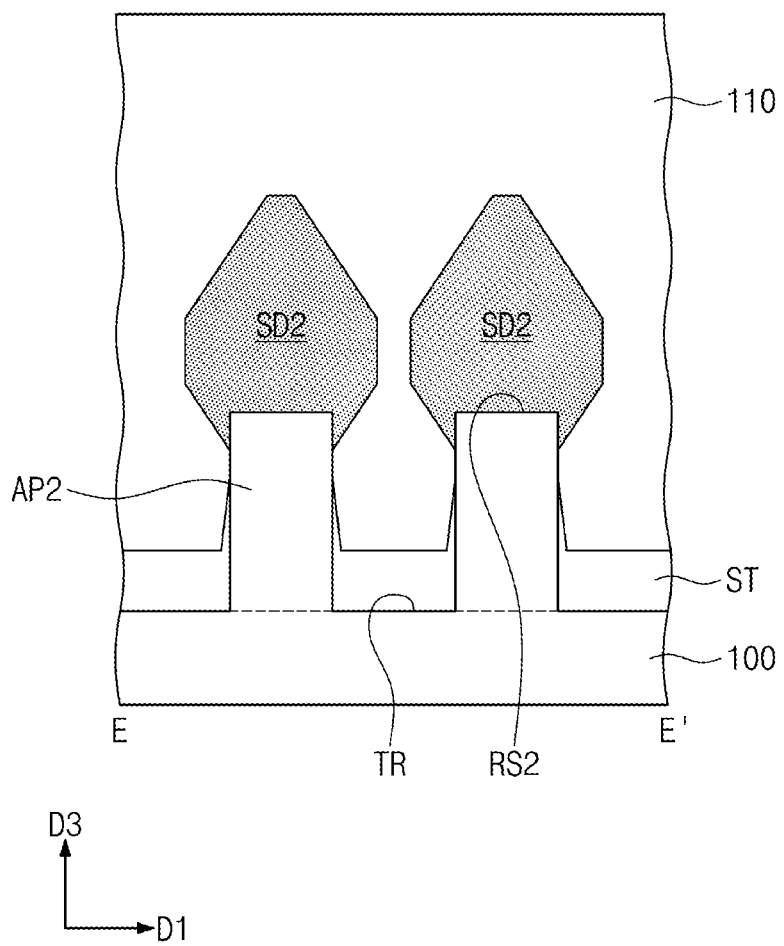

FIGS. 3, 5, 7, 9, and 11 illustrate plan views showing a method of manufacturing a semiconductor device according to exemplary embodiments of inventive concepts. FIGS. 4, 6A, 8A, 10A, and 12A illustrate cross-sectional views taken along line A-A' of FIGS. 3, 5, 7, 9, and 11, respectively. FIGS. 6B, 8B, 10B, and 12B illustrate cross-sectional views taken along line B-B' of FIGS. 5, 7, 9, and 11, respectively. FIGS. 6C, 8C, 10C, and 12C illustrate cross-sectional views taken along line C-C' of FIGS. 5, 7, 9, and 11, respectively. FIGS. 8D, 10D, and 12D illustrate cross-sectional views taken along line D-D' of FIGS. 7, 9, and 11, respectively. FIGS. 10E and 12E illustrate cross-sectional views taken along line E-E' of FIGS. 9 and 11, respectively.

Figure 3:
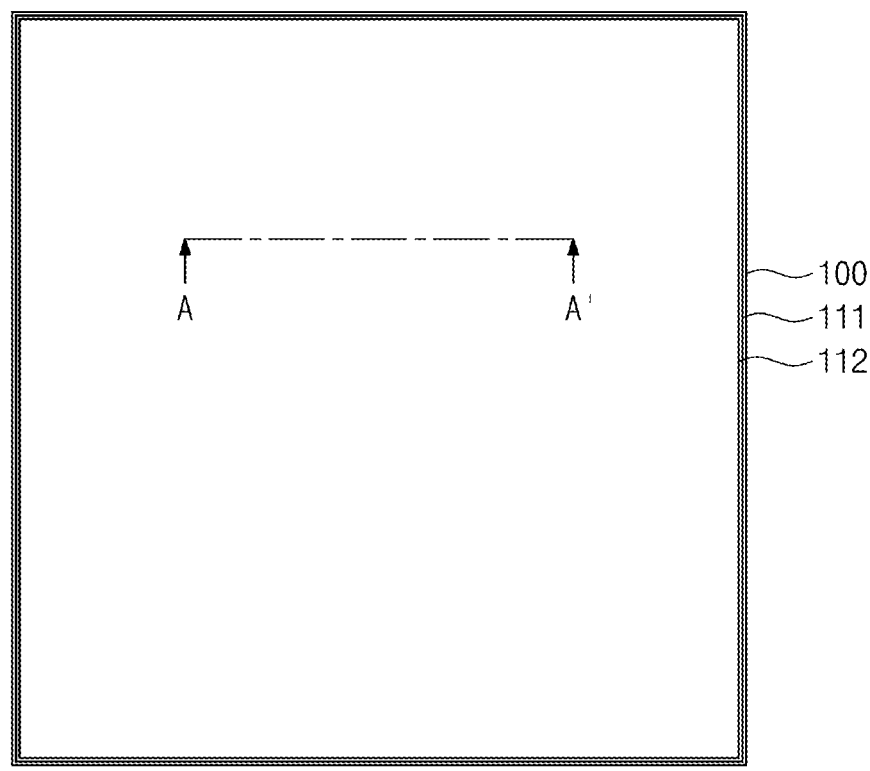
FIGS. 3, 5, 7, 9, and 11 illustrate plan views showing a method of manufacturing a semiconductor device according to aspects of the present disclosure.
Figure 3:
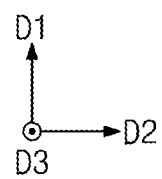
Figure 4:
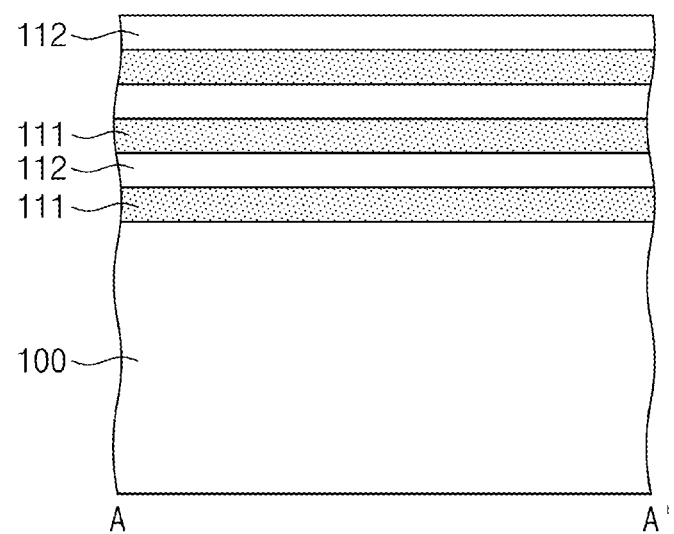
FIGS. 4, 6A, 8A, 10A, and 12A illustrate cross-sectional views taken along line A-A' of FIGS. 3, 5, 7, 9, and 11, respectively.
Figure 4:
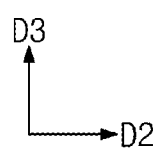
Figure 5:
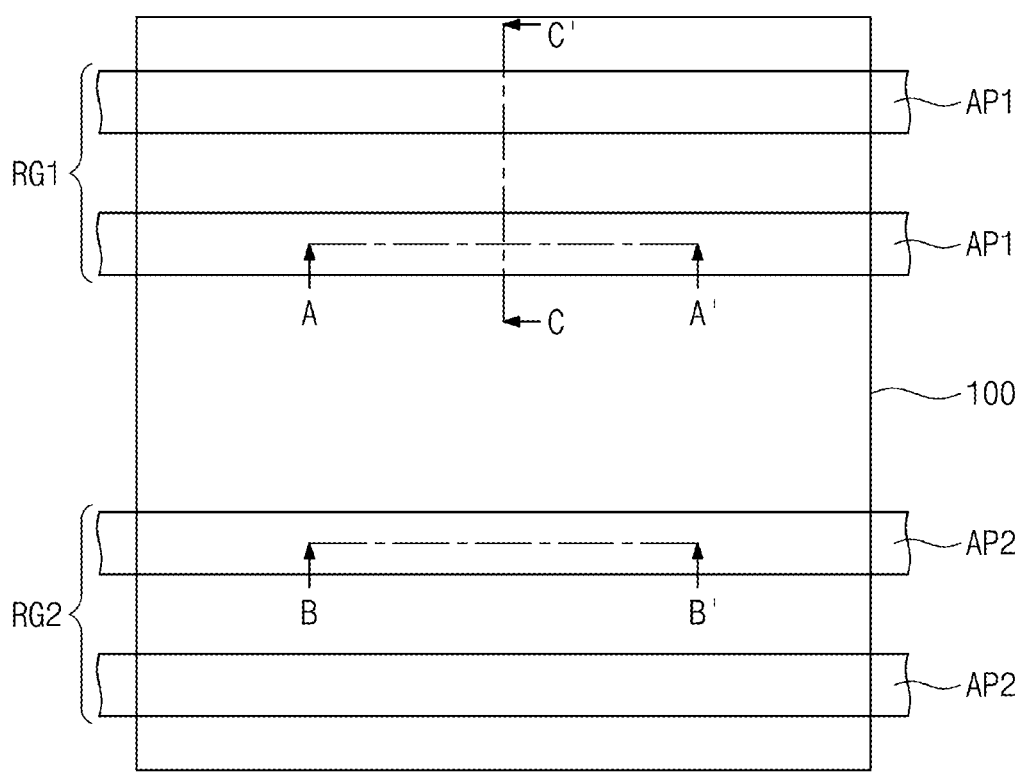
Figure 6A:
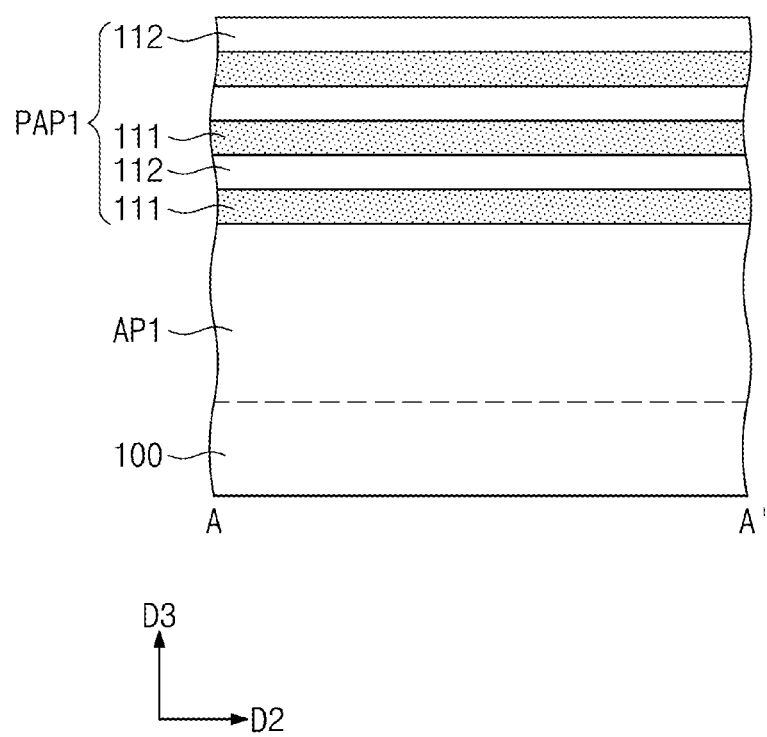
Figure 6B:
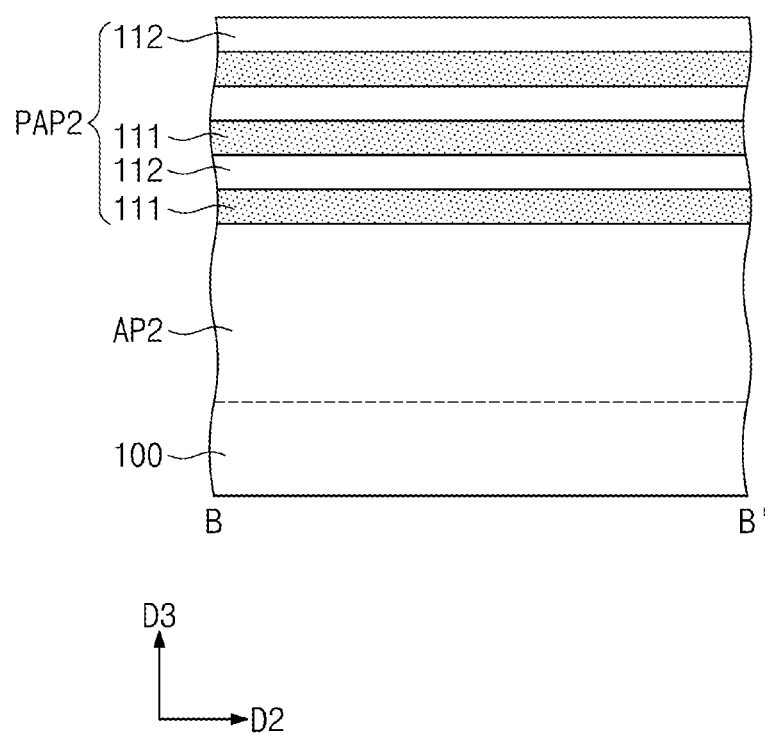
FIGS. 6B, 8B, 10B, and 12B illustrate cross-sectional views taken along line B-B' of FIGS. 5, 7, 9, and 11, respectively.
Figure 6C:
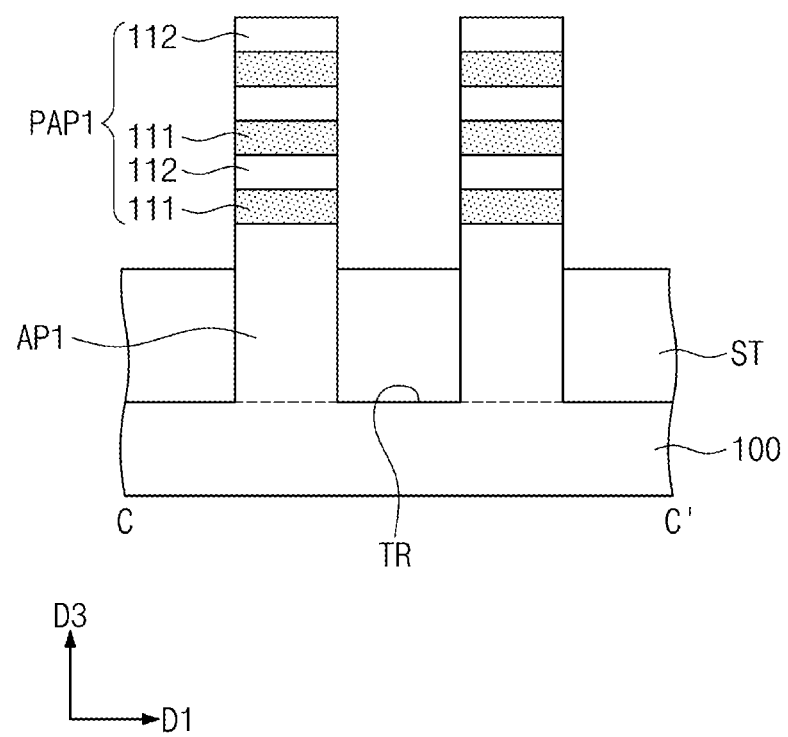
FIGS. 6C, 8C, 10C, and 12C illustrate cross-sectional views taken along line C-C' of FIGS. 5, 7, 9, and 11, respectively.
Figure 7:
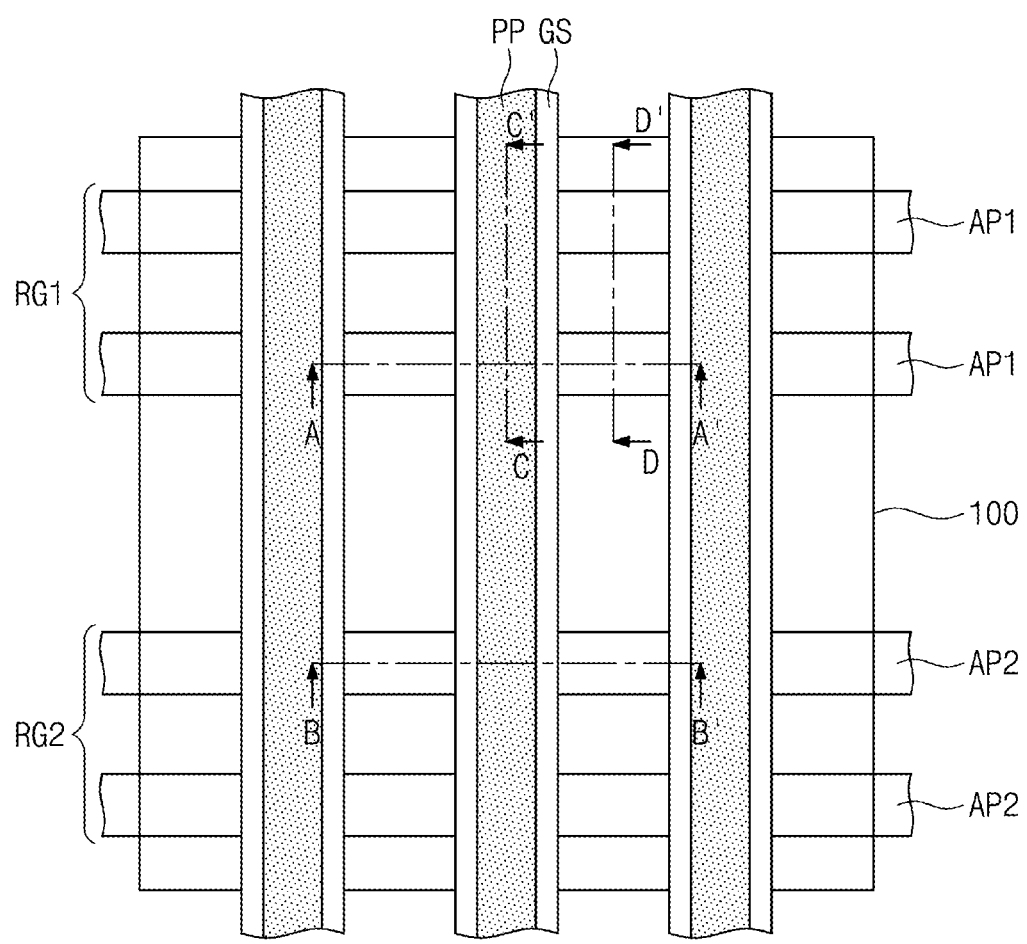

Referring to FIGS. 3 and 4, sacrificial layers 111 and semiconductor layers 112 may be alternately and repeatedly stacked on a surface (e.g., an entire surface) of a substrate 100. The semiconductor layers 112 may be repeatedly stacked three times, but the present disclosure is not limited thereto. The sacrificial layers 111 may include a material having an etch selectivity to the semiconductor layers 112. For example, the semiconductor layers 112 may include a material that is not substantially etched in or during a process in which the sacrificial layers 111 are etched. In some embodiments, in a process in which the sacrificial layers 111 are etched, an etch rate ratio of the sacrificial layers 111 to the semiconductor layers 112 may fall within a range from about 10:1 to about 200:1. For example, the sacrificial layers 111 may include silicon-germanium (SiGe) or germanium (Ge), and the semiconductor layers 112 may include silicon (Si).

The sacrificial layers 111 and the semiconductor layers 112 may be formed by an epitaxial growth process in which the substrate 100 is used as a seed layer. The sacrificial layers 111 and the semiconductor layers 112 may be successively formed in the same chamber. The sacrificial layers 111 and the semiconductor layers 112 may be conformally grown on the surface (e.g., the entire surface) of the substrate 100.

Referring to FIGS. 5 and 6A to 6C, the sacrificial layers 111 and the semiconductor layers 112 may be patterned to form first and second preliminary patterns PAP1 and PAP2 respectively on first and second regions RG1 and RG2 of the substrate 100. When the sacrificial layers 111 and the semiconductor layers 112 are patterned, an upper portion of the substrate 100 may be etched to form trenches TR defining first and second active patterns AP1 and AP2. The first and second active patterns AP1 and AP2 may be formed respectively on the first and second regions RG1 and RG2 of the substrate 100.

The first and second preliminary patterns PAP1 and PAP2 may be disposed respectively on the first and second active patterns AP1 and AP2. The first and second preliminary patterns PAP1 and PAP2 may vertically overlap the first and second active patterns AP1 and AP2, respectively. The first and second preliminary patterns PAP1 and PAP2 and the first and second active patterns AP1 and AP2 may be formed to have a linear or bar shape extending in a second direction D2.

A device isolation layer ST may be formed to fill the trenches TR. The formation of the device isolation layer ST may include forming an insulation layer on the surface of the substrate 100 (e.g., the entire surface of the substrate 100) and recessing the insulation layer to completely expose the first and second preliminary patterns PAP1 and PAP2. A top surface of the device isolation layer ST may become lower than top surfaces of the first and second active patterns AP1 and AP2.

Referring to FIGS. 7 and 8A to 8D, sacrificial patterns PP may be formed to run across or overlap the first and second preliminary patterns PAP1 and PAP2. The sacrificial patterns PP may be formed to have a linear or bar shape extending in a first direction D1.

The formation of the sacrificial patterns PP may include forming a sacrificial layer on the substrate 100, forming mask patterns MP on the sacrificial layer, and using the mask patterns MP as an etching mask to etch the sacrificial layer. The sacrificial layer may be formed using polysilicon. The mask patterns MP may be formed using a silicon oxide layer, a silicon nitride layer, or a silicon oxynitride layer.

A pair of gate spacers GS may be formed on opposite sidewalls of each of the sacrificial patterns PP. A pair of insulation spacers IS may be formed on opposite sidewalls of each of the first and second preliminary patterns PAP1 and PAP2 (as seen in FIG. 8D). The gate spacers GS and the insulation spacers IS may be formed at the same time. The gate spacers GS and the insulation spacers IS may include the same material as each other. For example, the gate spacers GS and the insulation spacers IS may include one or more of SiCN, SiCON, and SiN.

The formation of the gate spacers GS and the insulation spacers IS may include performing a deposition process, such as chemical vapor deposition (CVD) or atomic layer deposition (ALD), to form a spacer layer on the entire surface of the substrate 100, and performing an anisotropic etching process on the spacer layer.

Referring to FIGS. 9 and 10A to 10E, the mask patterns MP and the gate spacers GS may be used as an etching mask to etch the first and second preliminary patterns PAP1 and PAP2 to respectively form first and second channel patterns CH1 and CH2. The semiconductor layers 112 of each of the first and second preliminary patterns PAP1 and PAP2 may be patterned to form first, second, and third semiconductor patterns SP1, SP2, and SP3. Each of the first and second channel patterns CH1 and CH2 may include the first to third semiconductor patterns SP1 to SP3.

The first and second preliminary patterns PAP1 and PAP2 may be etched to respectively form first and second recessions RS1 and RS2. While the first and second preliminary patterns PAP1 and PAP2 are etched, the insulation spacers IS may be removed. An upper portion of the first active pattern AP1 may be over-etched such that the first recessions RS1 may have floors lower than the top surface of the first active pattern AP1. An upper portion of the second active pattern AP2 may be over-etched such that the second recessions RS2 may have floors lower than the top surface of the second active pattern AP2. The first channel pattern CH1 may be placed between a pair of neighboring first recessions RS1, and the second channel pattern CH2 may be placed between a pair of neighboring second recessions RS2.

The sacrificial layers 111 on the second region RG2 may be partially removed to form first depressions DR. The formation of the first depressions DR may include forming a hardmask pattern to selectively expose the second region RG2 and performing an isotropic etching process to partially etch the sacrificial layers 111 exposed to the second recessions RS2. For example, when the first to third semiconductor patterns SP1 to SP3 include silicon (Si), and when the sacrificial layers 111 include silicon-germanium (SiGe), the formation of the first depressions DR may include performing an etching process that uses an etchant including peracetic acid. When the first depressions DR are formed, boundaries between the first depressions DR and the sacrificial layers 111 may become concave toward the sacrificial layers 111. For example, the boundary between each of the first depressions DR and each of the sacrificial layers 111 may have a curvature other than zero.

Barrier insulation patterns BP may be formed to fill the first depression regions DR. The formation of the barrier insulation patterns BP may include conformally forming a barrier insulation layer to fill the first depressions DR on the second region RG2 and performing an isotropic etching process to partially etch the barrier insulation layer. For example, the barrier insulation layer may include a silicon nitride layer. Each of the barrier insulation patterns BP may have a first end and an opposite second end. The first end may have a concavely curved shape toward the sacrificial layer 111. For example, the first end may have a curvature other than zero. Each of the barrier insulation patterns BP may accordingly have a second convex portion BL2. Although not shown, each of the barrier insulation patterns BP may include a second depression. The second depression may be formed on the opposite end of the barrier insulation pattern BP. When the barrier insulation layer is conformally formed in the first depression DR, the first depression DR may be partially filled with the barrier insulation layer and have the second depression at its unfilled portion.

First source/drain patterns SD1 may be formed to fill the first recessions RS1. The formation of the first source/drain patterns SD1 may include performing a selective epitaxial growth process in which the first active pattern AP1 and the first to third semiconductor patterns SP1 to SP3 on the first active pattern AP1 are used as seed layers. The first source/drain patterns SD1 may be formed of a material that provides the first channel patterns CH1 with a compressive stress. For example, the first source/drain patterns SD1 may include a semiconductor element (e.g., SiGe) whose lattice constant is greater than that of a semiconductor element of the substrate 100. Simultaneously with or after the selective epitaxial growth process, the first source/drain patterns SD1 may be doped with p-type impurities.

Second source/drain patterns SD2 may be formed to fill the second recessions RS2. The formation of the second source/drain patterns SD2 may include performing a selective epitaxial growth process in which the second active pattern AP2 and the first to third semiconductor patterns SP1 to SP3 on the second active pattern AP2 are used as seed layers. For example, the second source/drain patterns SD2 may include the same semiconductor element (e.g., Si) as that of the substrate 100. Simultaneously with or after the selective epitaxial growth process, the second source/drain patterns SD2 may be doped with n-type impurities. Although not shown, the second source/drain patterns SD2 may fill the second depressions of the barrier insulation patterns BP.

Referring to FIGS. 11 and 12A to 12E, a first interlayer dielectric layer 110 may be formed on the substrate 100. A planarization process may be performed on the first interlayer dielectric layer 110 until top surfaces of the sacrificial patterns PP are exposed. The planarization process may include an etch-back process and/or a chemical mechanical polishing (CMP) process. When the first interlayer dielectric layer 110 is planarized, the mask patterns MP may also be removed. For example, the first interlayer dielectric layer 110 may be formed using a silicon oxide layer or a silicon oxynitride layer.

A removal process may be performed to selectively remove the sacrificial patterns PP that are exposed when the planarization process is carried out. The removal of the sacrificial patterns PP may form an empty space EP between a pair of neighboring gate spacers GS. The empty spaces EP may expose the first and second channel patterns CH1 and CH2 and the sacrificial layers 111.

Referring back to FIG. 12A, a first selective etching process may be performed to selectively remove the sacrificial layers 111 on the first region RG1 that are exposed to the empty spaces EP. When the sacrificial layers 111 are removed, opposite sidewalls of each of the first source/drain patterns SD1 may be partially exposed. The exposed opposite sidewalls may be selectively and partially removed by the first selective etching process. For example, when the sacrificial layers 111 and the first source/drain patterns SD1 include silicon-germanium (SiGe), and when the first to third semiconductor patterns SP1 to SP3 include silicon (Si), the first selective etching process may use an etchant including peracetic acid. The etchant may further include hydrofluoric acid (HF) solution and deionized water. As the sacrificial layers 111 and portions of the first source/drain patterns SD1 are selectively removed, there may be formed first to third cavities SA1 to SA3 and side recessions SR. The first to third cavities SA1 to SA3 may be spatially connected to the empty spaces EP, and therefore, each of the first to third semiconductor patterns SP1 to SP3 may be exposed on its top and bottom surfaces and its sidewalls. The side recessions SR may be located at the same level as that of corresponding first to third cavities SA1 to SA3. The side recessions SR may be located adjacent to corresponding first to third cavities SA1 to SA3. Each of the side recessions SR may have a concavely curved shape. For example, each of the side recessions SR may have a curvature other than zero.

On the first region RG1, the first cavity SA1 may be defined between the first active pattern AP1 and the first semiconductor pattern SP1, the second cavity SA2 may be defined between the first semiconductor pattern SP1 and the second semiconductor pattern SP2, and the third cavity SA3 may be defined between the second semiconductor pattern SP2 and the third semiconductor pattern SP3.

A width in the second direction D2 of the first cavity SA1 may increase with decreasing distance from the substrate 100. Stated differently, a width of the first cavity SA1 nearer to the substrate 100 may be greater than a width of the first cavity SA1 further from the substrate 100. A maximum width in the second direction D2 of the first cavity SA1 may be an eleventh width W11. A width in the second direction D2 of the second cavity SA2 may be less than the eleventh width W11. A maximum width in the second direction D2 of the second cavity SA2 may be a twelfth width W12. The twelfth width W12 may be less than the eleventh width W11. A width in the second direction D2 of the third cavity SA3 may be greater than the twelfth width W12. A maximum width in the second direction D2 of the third cavity SA3 may be a thirteenth width W13. The thirteenth width W13 may be greater than the twelfth width W12. A maximum width in the second direction D2 of the empty space EP may be a fourteenth width W14. The fourteenth width W14 may be less than the twelfth width W12.

Referring back to FIG. 12B, a second selective etching process may be performed to selectively remove the sacrificial layers 111 on the second region RG2 that are exposed to the empty spaces EP. For example, when the sacrificial layers 111 include silicon-germanium (SiGe), and when the first to third semiconductor patterns SP1 to SP3 include silicon (Si), the second selective etching process may use an etchant including peracetic acid. The etchant may further include hydrofluoric acid (HF) solution and deionized water. As the sacrificial layers 111 are selectively removed, first to third cavities SA1 to SA3 may be formed. The first to third cavities SA1 to SA3 may be spatially connected to the empty spaces EP, and therefore, each of the first to third semiconductor patterns SP1 to SP3 may be exposed on its top and bottom surfaces and its sidewalls. The second selective etching process may be the same as the first selective etching process, or may be different from the first selective etching process.

On the second region RG2, the first cavity SA1 may be defined between the second active pattern AP2 and the first semiconductor pattern SP1, the second cavity SA2 may be defined between the first semiconductor pattern SP1 and the second semiconductor pattern SP2, and the third cavity SA3 may be defined between the second semiconductor pattern SP2 and the third semiconductor pattern SP3.

Maximum widths in the second direction D2 of the first to third cavities SA1 to SA3 may be substantially the same as each other, or may be different from each other. For example, the maximum width in the second direction D2 of the first cavity SA1 may be a fifteenth width W15. A width in the second direction D2 of the second cavity SA2 may be less than the fifteenth width W15. For example, the maximum width in the second direction D2 of the second cavity SA2 may be a sixteenth width W16. The sixteenth width W16 may be less than the fifteenth width W15. A width in the second direction D2 of the third cavity SA3 may be less than the sixteenth width W16 of second cavity SA2. For example, the maximum width in the second direction D2 of the third cavity SA3 may be a seventeenth width W17. The seventeenth width W17 may be less than the sixteenth width W16. A maximum width in the second direction D2 of the empty space EP may be an eighteenth width W18. The eighteenth width W18 may be substantially the same as the seventeenth width W17.

Referring to FIGS. 1 and 2A to 2E, a gate dielectric pattern GI and a gate electrode GE may be formed in each of the empty spaces EP. The formation of the gate dielectric pattern GI and the gate electrode GE may include conformally forming a gate dielectric layer in the empty space EP and the first to third cavities SA1 to SA3 and forming a gate electrode layer to completely fill the empty space EP and the first to third cavities SA1 to SA3. When the first to third cavities SA1 to SA3 are filled with the gate electrode layer, first to third segments GP1 to GP3 may be respectively formed. When the empty space EP is filled with the gate electrode layer, a fourth segment GP4 may be formed. The first to fourth segments GP1 to GP4 may constitute the gate electrode GE. The gate dielectric layer may include a high-k dielectric material. The gate electrode layer may include one or more metal nitride and metal.

Gate capping patterns CP may be formed on the gate electrodes GE. For example, the gate capping layers CP may include one or more of SiON, SiCN, SiCON, and SiN. A second interlayer dielectric layer 120 may be formed on the first interlayer dielectric layer 110 and the gate capping patterns CP. Contacts CT may be formed to penetrate the first and second interlayer dielectric layers 110 and 120 to come into connection with the first and second source/drain patterns SD1 and SD2.

Referring to FIG. 2A, the gate dielectric pattern GI in each of the first to third cavities SA1 to SA3 may have opposite ends each of which has a convexly curved shape that conforms to that of the side recession SR. For example, each of the opposite ends may have a curvature other than zero. The first to third segments GP1 to GP3 of the gate electrode GE may each have opposite ends having convexly curved shapes that conform to those of the side recessions SR and those of the gate dielectric patterns GI in the first to third cavities SA1 to SA3. For example, each of the opposite ends may have a curvature other than zero. Each of the first to third segments GP1 to GP3 of the gate electrode GE may accordingly include first convex portions BL1.

Referring to FIG. 2B, the gate dielectric pattern GI in each of the first to third cavities SA1 to SA3 may have opposite ends each of which has a concavely curved shape that conforms to that of the second convex portion BL2 of the barrier insulation pattern BP. For example, each of the opposite ends may have a curvature other than zero. The first to third segments GP1 to GP3 of the gate electrode GE may each have opposite ends having concavely curved shapes that conform to those of the second convex portions BL2 of the barrier insulation patterns BP and those of the gate dielectric patterns GI in the first to third cavities SA1 to SA3. For example, each of the opposite ends may have a curvature other than zero. Each of the first to third segments GP1 to GP3 of the gate electrode GE may accordingly include concave portions CN.

A semiconductor device according to the inventive concepts may include a gate electrode having either convex portions or concave portions, and consequently may have an increase in electrical characteristics.

Although example embodiments of the inventive concepts have been discussed herein with reference to accompanying figures, it will be understood that various changes in form and details may be made therein without departing from the scope of the inventive concepts. It therefore will be understood that the example embodiments described herein are merely illustrative, but not limitative in all aspects.

What is claimed is:

1. A semiconductor device, comprising:
   a first channel pattern including a first semiconductor pattern, a second semiconductor pattern, and a third semiconductor pattern that are sequentially stacked on a substrate and vertically spaced apart from each other;
   a first source/drain pattern connected to the first, second and third semiconductor patterns of the first channel pattern; and
   a first gate electrode on the first channel pattern and extending in a first direction,
   wherein the first gate electrode includes a first segment between the substrate and the first semiconductor pattern, a second segment between the first semiconductor pattern and the second semiconductor pattern, and a third segment between the second semiconductor pattern and the third semiconductor pattern,
   wherein at least one of the second and third segments has a convex sidewall facing the first source/drain pattern,
   wherein a widest width of the third segment in a second direction is greater than a widest width of the second segment in the second direction,
   wherein a widest width of the first segment in the second direction is greater than the widest width of the third segment,
   wherein the first source/drain pattern includes a side recession facing a sidewall of the second segment, and
   wherein the sidewall of the second segment has a convex profile corresponding to the side recession of the first source/drain pattern.

2. The semiconductor device of claim 1, wherein the first gate electrode further includes a fourth segment on the third semiconductor pattern, and
   wherein the widest width of the second segment is greater than a widest width of the fourth segment in the second direction.

3. The semiconductor device of claim 2, further comprising:
   a pair of gate spacers on opposite sidewalls of the fourth segment, respectively;
   a gate capping pattern on a top surface of the fourth segment.

4. The semiconductor device of claim 1, wherein a widest width of the third semiconductor pattern in the second direction is greater than a widest width of the second semiconductor pattern in the second direction, and
   wherein a widest width of the first semiconductor pattern in the second direction is greater than the widest width of the third semiconductor pattern.

5. The semiconductor device of claim 1, further comprising:
   a second channel pattern including a fourth semiconductor pattern, a fifth semiconductor pattern, and a sixth semiconductor pattern that are sequentially stacked on the substrate and vertically spaced apart from each other;
   a second source/drain pattern connected to the fourth, fifth and sixth semiconductor patterns of the second channel pattern; and
   a second gate electrode on the second channel pattern and extending in the first direction,
   wherein the first and second source/drain patterns have different conductivities from each other.

6. The semiconductor device of claim 5, wherein the second gate electrode includes a fourth segment between the substrate and the fourth semiconductor pattern, a fifth segment between the fourth semiconductor pattern and the fifth semiconductor pattern, and a sixth segment between the fifth semiconductor pattern and the sixth semiconductor pattern, and
   wherein the widest width of the second segment is greater than a widest width of each of the fourth, fifth and sixth segments in the second direction.

7. The semiconductor device of claim 5, wherein the first channel pattern, the first source/drain pattern and the first gate electrode are provided on a PMOSFET region, and
   wherein the second channel pattern, the second source/drain pattern and the second gate electrode are provided on an NMOSFET region.

8. The semiconductor device of claim 1, wherein the first source/drain pattern comprises a middle portion having a widest width of the first source/drain pattern in the second direction, and
   wherein the middle portion is located equidistant from the substrate as the second semiconductor pattern.

9. A semiconductor device, comprising:
   a first channel pattern including a first semiconductor pattern, a second semiconductor pattern, and a third semiconductor pattern that are sequentially stacked on a substrate and vertically spaced apart from each other;
   a first source/drain pattern connected to the first, second and third semiconductor patterns of the first channel pattern; and
   a first gate electrode on the first channel pattern and extending in a first direction,
   wherein the first gate electrode includes a first segment between the substrate and the first semiconductor pattern, a second segment between the first semiconductor pattern and the second semiconductor pattern, and a third segment between the second semiconductor pattern and the third semiconductor pattern,
   wherein the first source/drain pattern includes a first side recession facing a sidewall of the first segment, a second side recession facing a sidewall of the second segment, and a third side recession facing a sidewall of the third segment, and
   wherein the sidewall of the second segment has a convex profile corresponding to the first side recession of the first source/drain pattern.

10. The semiconductor device of claim 9, wherein a widest width of the third segment in a second direction is greater than a widest width of the second segment in the second direction, and
    wherein a widest width of the first segment in the second direction is greater than the widest width of the third segment.

11. The semiconductor device of claim 10, wherein the first gate electrode further includes a fourth segment on the third semiconductor pattern, and
    wherein the widest width of the second segment is greater than a widest width of the fourth segment in the second direction.

12. The semiconductor device of claim 9, wherein a widest width of the third semiconductor pattern in a second direction is greater than a widest width of the second semiconductor pattern in the second direction, and
    wherein a widest width of the first semiconductor pattern in the second direction is greater than the widest width of the third semiconductor pattern.

13. The semiconductor device of claim 9, further comprising:
    a second channel pattern including a fourth semiconductor pattern, a fifth semiconductor pattern, and a sixth semiconductor pattern that are sequentially stacked on the substrate and vertically spaced apart from each other;

a second source/drain pattern connected to the fourth, fifth and sixth semiconductor patterns of the second channel pattern; and a second gate electrode on the second channel pattern and extending in the first direction, wherein the first and second source/drain patterns have different conductivities from each other.

14. The semiconductor device of claim 9, wherein the first source/drain pattern comprises a middle portion having a widest width of the first source/drain pattern in a second direction, and wherein the middle portion is located equidistant from the substrate as the second semiconductor pattern.

15. A semiconductor device, comprising:

a substrate including a PMOSFET region and an NMOSFET region;

a first channel pattern including a first semiconductor pattern, a second semiconductor pattern, and a third semiconductor pattern that are sequentially stacked on the PMOSFET region and vertically spaced apart from each other;

a first source/drain pattern connected to the first, second and third semiconductor patterns of the first channel pattern;

a first gate electrode on the first channel pattern and extending in a first direction, the first gate electrode including a first segment between the substrate and the first semiconductor pattern, a second segment between the first semiconductor pattern and the second semiconductor pattern, a third segment between the second semiconductor pattern and the third semiconductor pattern, a fourth segment on the third semiconductor pattern;

a first gate dielectric layer between the first gate electrode and the first channel pattern;

a pair of first gate spacers on opposite sidewalls of the fourth segment, respectively;

a first gate capping pattern on a top surface of the fourth segment;

an interlayer dielectric layer on the pair of first gate spacers and the first gate capping pattern; and a first contact penetrating the interlayer dielectric layer and connected to the first source/drain pattern, wherein a widest width of the second segment in a second direction is greater than a widest width of the fourth segment in the second direction, wherein a widest width of the third segment in the second direction is greater than the widest width of the second segment, wherein a widest width of the first segment in the second direction is greater than the widest width of the third segment, wherein the first source/drain pattern includes a side recession facing a sidewall of the second segment, and wherein the sidewall of the second segment has a convex profile corresponding to the side recession of the first source/drain pattern.

16. The semiconductor device of claim 15, wherein the first source/drain pattern has a width in the second direction that decreases from a top of the first segment toward a bottom of the first segment.

17. The semiconductor device of claim 15, further comprising:

a second channel pattern including a fourth semiconductor pattern, a fifth semiconductor pattern, and a sixth semiconductor pattern that are sequentially stacked on the NMOSFET region and vertically spaced apart from each other;

a second source/drain pattern connected to the fourth, fifth and sixth semiconductor patterns of the second channel pattern;

a second gate electrode on the second channel pattern and extending in the first direction, the second gate electrode including a fifth segment between the substrate and the fourth semiconductor pattern, a sixth segment between the fourth semiconductor pattern and the fifth semiconductor pattern, a seventh segment between the fifth semiconductor pattern and the sixth semiconductor pattern, an eighth segment on the sixth semiconductor pattern;

a second gate dielectric layer between the second gate electrode and the second channel pattern;

a pair of second gate spacers on opposite sidewalls of the eighth segment, respectively;

a second gate capping pattern on a top surface of the eighth segment; and a second contact penetrating the interlayer dielectric layer and connected to the second source/drain pattern, wherein the second source/drain pattern has a width in the second direction that decreases toward a bottom of the substrate.

18. The semiconductor device of claim 17, wherein the sixth segment has a concave sidewall recessed toward a center of the sixth segment.

19. The semiconductor device of claim 17 further comprising barrier insulation patterns between the second source/drain pattern and the fifth, sixth and seventh segments, respectively.

* * * * *